(12) United States Patent
 Zhang et al.

(10) Patent No.: US 11,538,776 B2
(45) Date of Patent: Dec. 27, 2022

(54) DRIVING BACKPLANE AND DISPLAY APPARATUS

(71) Applicants: Hefei Xinsheng Optoelectronics Technology Co., Ltd., Hefei (CN); BOE Technology Group Co., Ltd., Beijing (CN)

(72) Inventors: Tianyu Zhang, Beijing (CN); Min He, Beijing (CN); Xiaodong Xie, Beijing (CN); Tengfei Zhong, Beijing (CN); Huayu Sang, Beijing (CN); Ting Zeng, Beijing (CN); Yuan Li, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 23 days.

(21) Appl. No.: 17/356,772

(22) Filed: Jun. 24, 2021

(65) Prior Publication Data
 US 2022/0093540 A1   Mar. 24, 2022

(30) Foreign Application Priority Data

Sep. 24, 2020 (CN) .......................... 202011017476.8
Sep. 28, 2020 (CN) .......................... 202011038435.7

(51) Int. Cl.
 *H01L 27/12* (2006.01)
 *H01L 23/00* (2006.01)
 *H01L 25/16* (2006.01)

(52) U.S. Cl.
 CPC .............. *H01L 24/02* (2013.01); *H01L 24/06* (2013.01); *H01L 25/167* (2013.01); *H01L 27/1244* (2013.01); *H01L 2224/0233* (2013.01); *H01L 2224/02373* (2013.01); *H01L 2224/02375* (2013.01); *H01L 2224/02379* (2013.01); *H01L 2224/06155* (2013.01)

(58) Field of Classification Search
 CPC ..... H01L 2224/0233–06155; H01L 24/02–10; H01L 27/1244
 See application file for complete search history.

(56) References Cited

U.S. PATENT DOCUMENTS

| | | | |
|---|---|---|---|
| 2017/0031389 A1* | 2/2017 | Yoo | G06F 3/0443 |
| 2018/0226460 A1* | 8/2018 | Zhu | H01L 27/3246 |
| 2020/0301219 A1* | 9/2020 | Kuroe | G09G 3/3611 |
| 2022/0005909 A1* | 1/2022 | Du | H01L 27/3276 |

\* cited by examiner

*Primary Examiner* — Hoa B Trinh
(74) *Attorney, Agent, or Firm* — Workman Nydegger

(57) ABSTRACT

The present disclosure provides a driving backplane and a display apparatus. The driving backplane includes: a substrate, and signal wires, binding electrodes and connection wires arranged on the substrate; at least one of the signal wires extends in a first direction; a first end of any one of the connection wires is electrically connected with at least one of the binding electrodes, and a second end of any one of the connection wires is electrically connected with one of the signal wires; a wire width of at least one of the connection wires at the first end is smaller than a wire width at the second end; and at least one of the connection wires includes: a first straight wire portion extending in the first direction, and an oblique wire portion with an extending direction forming a certain included angle with the first direction.

20 Claims, 12 Drawing Sheets

DRIVING BACKPLANE AND DISPLAY APPARATUS

CROSS-REFERENCE TO RELATED APPLICATIONS

The present application claims priority to Chinese Patent Application No. 202011017476.8, filed to the China Patent Office on Sep. 24, 2020 and entitled "DRIVING BACKPLANE AND DISPLAY APPARATUS", and Chinese Patent Application No. 202011038435.7, filed to the China Patent Office on Sep. 28, 2020 and entitled "DRIVING BACKPLANE AND DISPLAY APPARATUS", the entire contents of which are incorporated herein by reference.

FIELD

The present disclosure relates to the technical field of display, in particular to a driving backplane and a display apparatus.

BACKGROUND

With development of a light emitting diode (LED) technology, a miniature light emitting diode display technology will become a next-generation revolutionary technology. The miniature light emitting diode display technology is a display technology achieved by making a traditional LED structure miniaturized and matriculated, and fabricating a driving backplane through an integrated circuit process, thereby realizing addressing control and independent driving of each pixel.

SUMMARY

Embodiments of the present disclosure provide a driving backplane and a display apparatus, where the driving backplane includes:

a substrate, and a plurality of signal wires, a plurality of binding electrodes and a plurality of connection wires arranged on the substrate; where at least one of the plurality of signal wires extends in a first direction;

a first end of any one of the plurality of connection wires is electrically connected with at least one of the plurality of binding electrodes, and a second end of the any one of the plurality of connection wires is electrically connected with one of the plurality of signal wires;

a wire width of at least one of the plurality of connection wires at the first end is smaller than a wire width at the second end;

the at least one of the plurality of connection wires includes: a first straight wire portion extending in the first direction, and an oblique wire portion with an extending direction forming a certain included angle with the first direction; and one end of the first straight wire portion is electrically connected with a part of the plurality of the binding electrodes, and the other end of the first straight wire portion is electrically connected with one of the plurality of signal wires through the oblique wire portion.

In some implementations, the driving backplane provided by the embodiment of the present disclosure includes a plurality of rows of light emitting regions arranged in sequence in the first direction; where an orthographic projection of at least one of the plurality of connection wires on the substrate overlaps with an orthographic projection of a first row of light emitting region on the substrate; and the first row of light emitting regions are light emitting regions closest to one side edge, provided with the plurality of binding electrodes, of the substrate among the plurality of rows of light emitting regions.

In some implementations, in the driving backplane provided by the embodiment of the present disclosure, in a direction from the first end of the connection wire to the second end, a wire width of the oblique wire portion in a direction perpendicular to its own extending direction is gradually increased, and the wire width of the oblique wire portion is larger than or equal to that of the first straight wire portion.

In some implementations, in the driving backplane provided by the embodiment of the present disclosure, the first straight wire portion of at least one of the plurality of connection wires includes two auxiliary side edges in the first direction, and a width of a part of the first straight wire portion corresponding to an overlap region of projections of the two auxiliary side edges in the first direction is consistent in a direction perpendicular to the first direction.

In some implementations, in the driving backplane provided by the embodiment of the present disclosure, in a second direction, a length of each of first straight wire portions in the first direction is in a trend of increasing firstly and then decreasing; and the second direction is a direction perpendicular to the first direction.

In some implementations, in the driving backplane provided by the embodiment of the present disclosure, in the second direction, the lengths of the first straight wire portions in the first direction are symmetrically distributed along a symmetrical axis in the first direction.

In some implementations, in the driving backplane provided by the embodiment of the present disclosure, on one side of the symmetrical axis, a length of one of the two auxiliary side edges of each of the first straight wire portions close to the symmetrical axis is larger than or equal to a length of the other auxiliary side edge, and as for any two first straight wire portions arranged in the second direction, any one of the two auxiliary side edges of one first straight wire portion closer to the symmetrical axis is larger than or equal to any one of the two auxiliary side edges of the other first straight wire portion.

In some implementations, in the driving backplane provided by the embodiment of the present disclosure, at least one of the plurality of connection wires further includes: a second straight wire portion extending in the first direction;

the oblique wire portion is electrically connected with the signal wire through the second straight wire portion; and a wire width of the second straight wire portion is larger than or equal to that of the oblique wire portion.

In some implementations, in the driving backplane provided by the embodiment of the present disclosure, the second straight wire portion of at least one of the plurality of connection wires includes two auxiliary side edges in the first direction, and a width of a part of the second straight wire portion corresponding to an overlap region of projections of the two auxiliary side edges in the first direction is consistent in a direction perpendicular to the first direction.

In some implementations, in the driving backplane provided by the embodiment of the present disclosure, in the second direction, a length of each of second straight wire portions in the first direction is in a trend of decreasing firstly and then increasing; and the second direction is a direction perpendicular to the first direction.

In some implementations, in the driving backplane provided by the embodiment of the present disclosure, in the second direction, the lengths of the second straight wire portions in the first direction are symmetrically distributed along the symmetrical axis in the first direction.

In some implementations, in the driving backplane provided by the embodiment of the present disclosure, on one side of the symmetrical axis, a length of one of the two auxiliary side edges of each of the second straight wire portions close to the symmetrical axis is smaller than or equal to a length of the other auxiliary side edge, and as for any two second straight wire portions arranged in the second direction, any one of the two auxiliary side edges of one second straight wire portion closer to the symmetrical axis is smaller than or equal to any one of the two auxiliary side edges of the other second straight wire portion.

In some implementations, in the driving backplane provided by the embodiment of the present disclosure, the wire width of the at least one connection wire at the second end is consistent with a wire width of one of the plurality of signal wires.

In some implementations, in the driving backplane provided by the embodiment of the present disclosure, the wire width of the at least one connection wire at the first end is larger than a width of each of the plurality of binding electrodes connected thereto correspondingly.

In some implementations, in the driving backplane provided by the embodiment of the present disclosure, a wire width of one of the plurality of signal wires is 20-130 times a width of one of the plurality of binding electrodes.

In some implementations, in the driving backplane provided by the embodiment of the present disclosure, the plurality of signal wires include: a plurality of power source signal wires, and a plurality of grounding wires;

the driving backplane further includes: a plurality of connection electrodes arranged in pairs and to be bound to light emitting diodes; and one of the connection electrodes arranged in pairs is electrically connected with one of the power source signal wires, and the other connection electrode is electrically connected with one of the grounding wires.

In some implementations, in the driving backplane provided by the embodiment of the present disclosure, a minimum wire width of the oblique wire portion electrically connected with at least one of the plurality of power source signal wires is the same as that of the oblique wire portion electrically connected with at least one of the plurality of grounding wires.

In some implementations, in the driving backplane provided by the embodiment of the present disclosure, a wire width of the power source signal wire or the grounding wire is in a range from 1500 μm to 9000 μm;

the minimum wire width of the oblique wire portion electrically connected with at least one of the plurality of power source signal wires is in a range from 1800 μm to 1815 μm; and a difference between the number of the binding electrodes electrically connected with the power source signal wire and the number of the binding electrodes electrically connected with the grounding wire is one or two.

An embodiment of the present disclosure further provides a display apparatus, including: the driving backplane mentioned above, and a plurality of light emitting diodes electrically connected with the driving backplane.

DETAILED DESCRIPTION OF THE EMBODIMENTS

Figure 1:
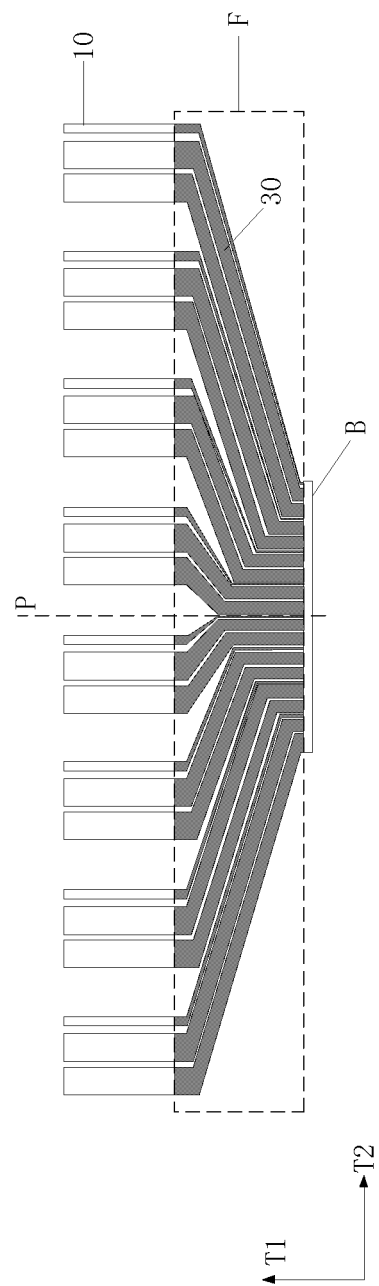
FIG. 1 is a first schematic structural diagram of a driving backplane provided by an embodiment of the present disclosure.

In the related art, as for a miniature light emitting diode display apparatus, a wire width of a signal wire in a driving backplane is large and may reach 3.8 mm or even larger, light emitting diodes are densely arranged, a frame is narrow, and consequently the difficulty of wire connection of a fan out region is large.

In order to solve the problem that the difficulty of wire connection of the fan out region in the miniature light emitting diode display apparatus is large, embodiments of the present disclosure provide a driving backplane and a display apparatus.

Specific implementations of the driving backplane and the display apparatus provided by the embodiments of the present disclosure will be described in detail below in combination with accompanying drawings. Sizes and shapes of all parts in the drawings do not reflect a true scale and are only intended to illustrate contents of the present disclosure.

Figure 2A:
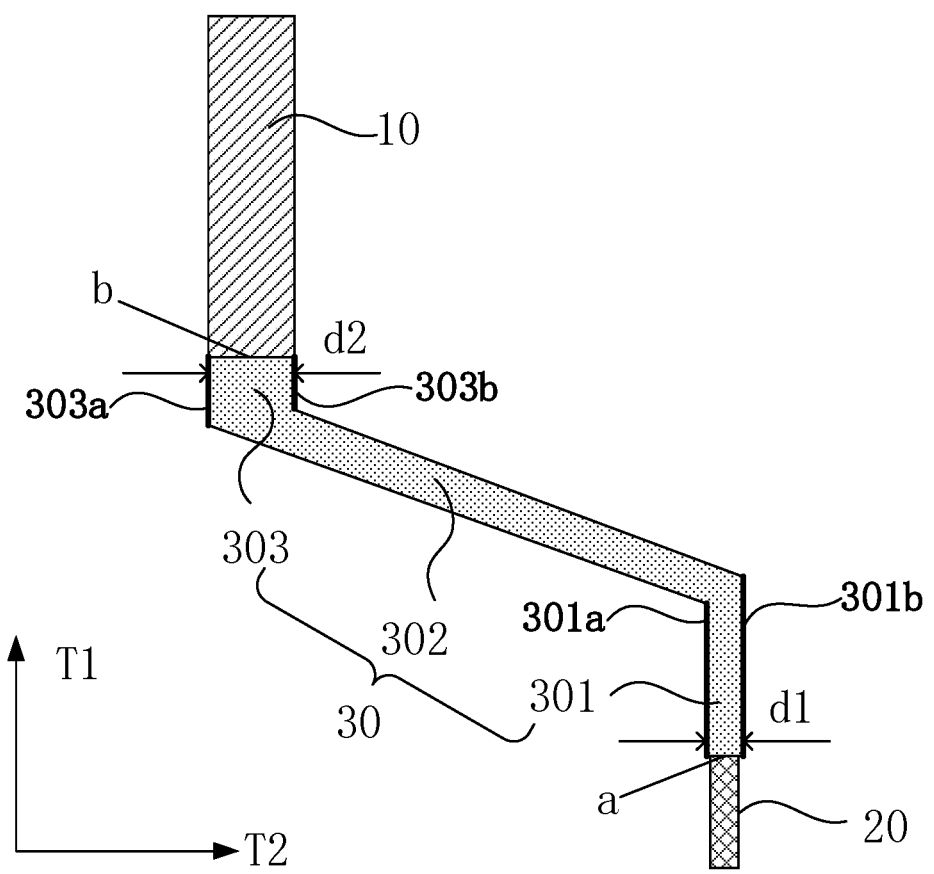
FIG. 2A is a schematic partial enlargement diagram of FIG. 1.

An embodiment of the present disclosure provides a driving backplane, as shown in FIG. 1 illustrating a schematic structural diagram of a driving backplane provided by an embodiment of the present disclosure, and FIG. 2A illustrating a schematic partial enlargement diagram of FIG. 1, including: a substrate (not shown), and a plurality of signal wires 10, a plurality of binding electrodes 20 and a plurality of connection wires 30 arranged on the substrate;

at least one of the signal wires 10 extends in a first direction (e.g., a direction shown by an arrow T1 in a figure);

a first end a of any one connection wire 30 is electrically connected with at least one of the binding electrodes 20, and a second end b is electrically connected with one of the signal wires 10;

a wire width d1 of at least one of the connection wires 30 at the first end a is smaller than a wire width d2 at the second end b;

at least one of the connection wires 30 includes: a first straight wire portion 301 extending in the first direction T1, and an oblique wire portion 302 with an extending direction forming a certain included angle with the first direction T1; and one end of the first straight wire portion 301 is electrically connected with part of the binding electrode 20, and the other end of the first straight wire portion 301 is electrically connected with the signal wire 10 through the oblique wire portion 302.

In the driving backplane provided by the embodiment of the present disclosure, the signal wires are electrically connected with the corresponding binding electrodes through the connection wires, the wire width of at least one of the connection wires at the first end is smaller than the wire width at the second end, and at least one of the connection wires includes the first straight wire portion and the oblique wire portion. Through the wire connection mode, a wiring space of the driving backplane may be utilized fully, all the connection wires may meet the requirement of a driving circuit, a certain distance may exist between the connection wires, a phenomenon of crossing of the connection wires is prevented, moreover, an area of a fan out region may be reduced, and the wiring difficulty of the signal wires is reduced.

Referring to FIG. 1 and FIG. 2A, in a miniature light emitting diode display apparatus, a binding region B is generally located at an edge of the driving backplane. The binding region B includes the plurality of binding electrodes 20, and the binding electrodes 20 may be connected with a driving chip or a flexible circuit board and other elements in a bound mode, so that the number and the sizes of the binding electrodes 20 in the binding region B need to be matched with the elements like the driving chip or the flexible circuit board, etc. In order to guarantee that a whole apparatus is light, thin and narrow-framed, generally, a size of the driving chip or the flexible circuit board and other elements is small, so that a width of the binding region B is small, and a size of each of the binding electrodes 20 in the binding region B is small.

However, differing from a liquid crystal display apparatus, a touch apparatus and other electronic equipment, in the miniature light emitting diode display apparatus, in order to guarantee properties of products, it is guaranteed that the signal wires on the driving backplane have a certain wire width, 3.8 mm or even larger. Besides, due to limit of a design space, the signal wires may not be electrically connected with the corresponding binding electrodes. In the embodiment of the present disclosure, the signal wires 10 are electrically connected with the corresponding binding electrodes 20 through the connection wires 30; the wire width d1 of at least one of the connection wires 30 at the first end a is smaller than the wire width d2 at the second end b; and at least one of the connection wires 30 includes the first straight wire portion 301 and the oblique wire portion 302; where the certain included angle is formed between the extending direction of the oblique wire portion 302 and the first direction T1, thus a space in the driving backplane may be utilized reasonably, and the signal wires 10 may be electrically connected with the corresponding binding electrodes 30. As shown in FIG. 1, the connection wires 30 are located in the fan out region F. Through a connection mode in the embodiment of the present disclosure, the area of the fan out region may be reduced, and design of a narrow frame is further facilitated.

It should be noted that in the embodiment of the present disclosure, the wire width of each connection wire may be constructed as a width of the connection wire in a direction perpendicular to its own extending direction.

During specific implementation, the number of the binding electrodes connected with each of the signal wires may be determined according to the width of the binding region B, the number of the signal wires in the driving backplane, etc. FIG. 2A makes illustration by taking electrical connection of one signal wire 10 with one binding electrode 20 for example. During specific implementation, one signal wire 10 may be electrically connected with the plurality of binding electrodes 20, and a corresponding relation between the signal wires 10 and the binding electrodes 20 is not limited herein.

In the embodiment of the present disclosure, the wire width d1 of at least one of the connection wires 30 at the first end a is smaller than the wire width d2 at the second end b. For example, in a direction from the first end a of the connection wire 30 to its second end b, the wire width of at least one of the connection wires 30 is in a trend of gradually increasing. It should be noted herein that the wire width of the connection wire 30 may be gradually increased from the first end a to the second end b, or the wire width of a part of the connection wire 30 is gradually increased, the wire width of the rest may not change as long as the wire width of the connection wire 30 is in a trend of gradually increasing in a whole.

During specific implementation, in the driving backplane provided by the embodiment of the present disclosure, as shown in FIG. 2A, in the direction from the first end a of the connection wire 30 to its second end b, the wire width of the oblique wire portion 302 in the direction perpendicular to its own extending direction is gradually increased. The wire width of the oblique wire portion 302 is larger than or equal to that of the first straight wire portion 301. Namely, in the direction from the second end b of the connection wire 30 to its first end a, the wire width of the oblique wire portion 302 is gradually reduced, moreover the certain included angle is formed between the extending direction of the oblique wire portion 302 and the first direction T1, thus the oblique wire portion 302 is oblique towards the binding electrodes 20, so that the signal wires 10 may be connected with the corresponding binding electrodes 20 through the connection wires 30, and the wiring space of the driving backplane may be fully utilized.

In the driving backplane provided by the embodiment of the present disclosure, as shown in FIG. 2A, the first straight wire portion 301 of at least one of the connection wires 30 includes two auxiliary side edges (e.g., 301*a* and 301*b* in FIG. 2A) in the first direction T1, and a width of a part of the first straight wire portion 301 corresponding to an overlap region of projections of the two auxiliary side edges in the first direction T1 is consistent in a direction perpendicular to the first direction T1. By arranging the first straight wire portion 301 extending in the first direction T1 in the connection wire 30, the connection wire 30 may be electrically connected with the binding electrodes 20. Besides, the width of a part of the first straight wire portion 301 corresponding to the overlap region of the projections of the two auxiliary side edges in the first direction T1 is consistent in the direction perpendicular to the first direction T1, thus the first straight wire portion which is matched with the width of the corresponding binding electrodes and meets the requirement of a distance between the adjacent connection wires is obtained, and the adjacent connection wires may be prevented from shorting or signal crosstalk.

It should be noted that in the embodiment of the present disclosure, the wire width of a part of the first straight wire portion 301 corresponding to the overlap region of the projections of the two auxiliary side edges in the first direction T1 is consistent in the direction perpendicular to the first direction T1, which may be constructed as: a difference between wire widths of positions in this part of the first straight wire portion 301 is smaller than a set value, namely the wire widths of positions in this part of the first straight wire portion 301 are the same approximately.

During actual application, in the driving backplane provided by the embodiment of the present disclosure, as shown in FIG. 1 and FIG. 2A, in a second direction T2, lengths of all the first straight wire portions 301 in the first direction T1 are in a trend of increasing firstly and then decreasing. The second direction T2 is a direction perpendicular to the first direction T1. As shown in FIG. 1, portions of the connection wires 30 connected with the binding region B are the first straight wire portions. It may be seen clearly in FIG. 1 that in the second direction T2, namely, a direction from left to right, the lengths of the first straight wire portions in the first direction T1 are in a trend of increasing firstly and then decreasing. Namely, in the plurality of connection wires 30 in the driving backplane, the length of the first straight wire portion in the middle is larger while the lengths of the first straight wire portions on the two sides are smaller, in this way, a space of the fan out region F may be utilized more reasonably, and the signal wires 10 may be electrically connected with the corresponding binding electrodes.

In the plurality of signal wires 10 in the driving backplane, the signal wire 10 in the middle is closer to the binding region B, so that the oblique wire portion of the connection wire 30 corresponding to the signal wire 10 in the middle may be shorter, and the signal wires 10 on the two sides are farther from the binding region B; so that the oblique wire portions of the connection wires 30 corresponding to the signal wires 10 on the two sides need to be longer. Therefore, by making the length of the first straight wire portion in the middle larger and the lengths of the first straight wire portions on the two sides smaller, the space of the fan out region F may be utilized more reasonably.

Furthermore, in the driving backplane provided by the embodiment of the present disclosure, as shown in FIG. 1, in the second direction T2, the lengths of all the first straight wire portions 301 in the first direction T1 are symmetrically distributed along a symmetrical axis P in the first direction T1. In this way, the space of the fan out region F may be utilized more reasonably, wiring design in the fan out region F is facilitated, and all the connection wires 30 in the fan out region F may meet the requirement of circuit layout.

It should be noted that in the embodiment of the present disclosure, referring to FIG. 2A, the length of the first straight wire portion 301 in the first direction T1 may be constructed as: a length of a part of the first straight wire portion 301 corresponding to the overlap region of projections of the two auxiliary side edges 301a and 301b in the first direction T1 prevails, namely a length of a region where the width of the first straight wire portion 301 is consistent prevails.

Figure 2B:
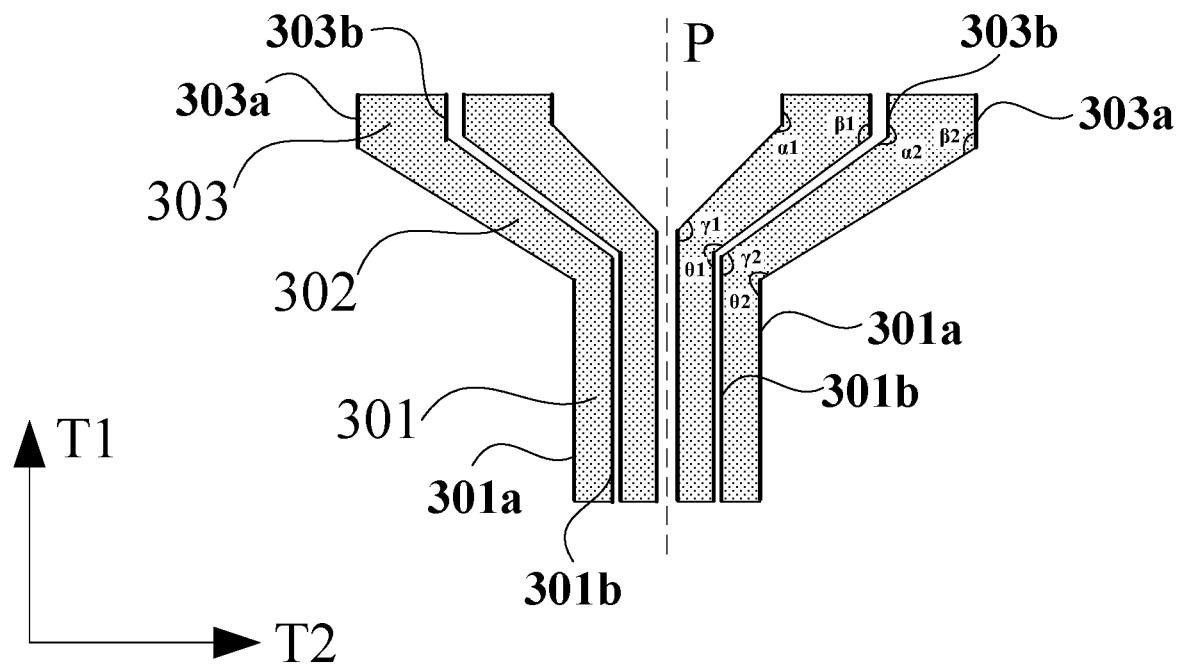
FIG. 2B is a schematic partial enlargement diagram of four connection wires arranged symmetrically relative to a symmetrical axis P in FIG. 1.

FIG. 2B is a schematic partial enlargement diagram of four connection wires arranged symmetrically relative to a symmetrical axis P in FIG. 1. As shown in FIG. 2B, in the driving backplane provided by the embodiment of the present disclosure, on one side of the symmetrical axis P, a length of one of the two auxiliary side edges, close to the symmetrical axis P, of each first straight wire portion 301 is larger than or equal to that of the other auxiliary side edge. FIG. 2B makes illustration by taking the auxiliary side edge 301b close to the symmetrical axis P and the auxiliary side edge 301a far away from the symmetrical axis P for example, namely in each first straight wire portion 301, the length of the auxiliary side edge 301b is larger than that of the auxiliary side edge 301a; and as for any two first straight wire portions 301 arranged in the second direction T2, any one of the two auxiliary side edges of one first straight wire portion 301 closer to the symmetrical axis P is larger than or equal to any one of the two auxiliary side edges of the other first straight wire portion 301. For example, in FIG. 2B, on one hand, as for the two first straight wire portions 301 on the left side of the symmetrical axis P, the lengths of the two auxiliary side edges of one first straight wire portion 301 closer to the symmetrical axis P are larger than the lengths of the two auxiliary side edges of the other first straight wire portion. In this way, the first straight wire portions with smaller widths may be obtained so as to meet the requirement of a distance between the adjacent connection wires and prevent signal crosstalk between the adjacent signal wires. On the other hand, a larger included angle in two included angles between the auxiliary side edge 301a of the first straight wire portion 301 and side edges of the oblique wire portion 302 connected with the auxiliary side edge 301a is a first included angle; a smaller included angle in two included angles between the auxiliary side edge 301b of the first straight wire portion 301 and the side edges of the oblique wire portion 302 connected with the auxiliary side edge 301b is a second included angle; and thus on one side of the symmetrical axis P, the larger a distance between the first straight wire portion 301 and the symmetrical axis P is, the larger the first included angle is and the smaller the second included angle is. For example, in FIG. 2B, in the two adjacent connection wires 30 on a right side of the symmetrical axis P, the first included angle θ1 is smaller than the first included angle θ2, and the second included angle γ1 is larger than the second included angle γ2.

Furthermore, in the driving backplane provided by the embodiment of the present disclosure, as shown in FIG. 1 and FIG. 2A, at least one of the plurality of connection wires 30 may further include: a second straight wire portion 303 extending in the first direction T1;

the oblique wire portion 302 is electrically connected with the signal wire 10 through the second straight wire portion 303; and a wire width of the second straight wire portion 303 is larger than or equal to that of the oblique wire portion 302.

In the embodiment of the present disclosure, all the connection wires 30 are located in the fan out region F. By arranging the second straight wire portions 303, the length and the inclination of the oblique wire portion 302 in each of the connection wires 30 may be adjusted, and thus all the signal wires 10 may be electrically connected with the corresponding binding electrodes 20 through the connection wires 30. Besides, a certain distance is maintained between all the connection wires 30, and the adjacent connection wires 30 are prevented from shorting, so that the space may be utilized more reasonably, the vertical (e.g., a direction shown by an arrow T1 in figure) occupied space of the fan out region F is smaller, and the design of a narrow frame is further facilitated.

During specific implementation, in the driving backplane provided by the embodiment of the present disclosure, as shown in FIG. 2A, the second straight wire portion 303 of at least one of the connection wires 30 includes two auxiliary side edges (e.g., 303a and 303b in FIG. 2A) in the first direction T1. A width of a part of the second straight wire portion 303 corresponding to an overlap region of projections of the two auxiliary side edges in the first direction T1 is consistent in a direction perpendicular to the first direction T1, and thus the adjacent connection wires 30 may be prevented from shorting.

It should be noted that in the embodiment of the present disclosure, the width of a part of the second straight wire portion 303 corresponding to the overlap region of projections of the two auxiliary side edges in the first direction T1 is consistent in the direction perpendicular to the first direction T1 may be constructed as: a difference between wire widths of positions in this part of the second straight wire portion 303 is smaller than a set value, namely the wire widths of the positions in this part of the second straight wire portion 303 are the same approximately.

During actual application, in the driving backplane provided by the embodiment of the present disclosure, as shown in FIG. 1 and FIG. 2A, in the second direction T2, lengths of all the second straight wire portions 303 in the first direction T1 are in a trend of decreasing firstly and then increasing; and the second direction T2 is a direction perpendicular to the first direction T1. As shown in FIG. 1, portions of the connection wires 30 connected with the signal wires 10 are the second straight wire portions. It may be seen clearly in FIG. 1 that in the second direction T2, namely a direction from left to right, the lengths of the second straight wire portions in the first direction T1 are in a trend of decreasing firstly and then increasing. Namely, in the plurality of connection wires 30 in the driving backplane, the length of the second straight wire portion in the middle is smaller, and the lengths of the second straight wire portions on the two sides are larger. In this way, the space of the fan out region F may be utilized more reasonably, and the signal wires 10 may be electrically connected with the corresponding binding electrodes.

In the plurality of signal wires 10 in the driving backplane, the signal wire 10 in the middle is closer to the binding region B, so that the oblique wire portion of the connection wire 30 corresponding to the signal wire 10 in the middle may be shorter; while the signal wires 10 on the two sides are farther from the binding region B, so that the oblique wire portions of the connection wires 30 corresponding to the signal wires 10 on the two sides need to be longer. In the embodiment of the present disclosure, by making the length of the first straight wire portion in the middle larger and the lengths of the first straight wire portions on the two sides smaller, and making the length of the second straight wire portion in the middle smaller and the lengths of the second straight wire portions on the two sides larger, the lengths and the inclinations of the oblique wire portions in all the connection wires may be adjusted, the signal wires may be electrically connected with the corresponding binding electrodes through the connection wires, and the space of the fan out region F may be utilized more reasonably.

Furthermore, in the driving backplane provided by the embodiment of the present disclosure, as shown in FIG. 1, in the second direction T2, the lengths of all the second straight wire portions 303 in the first direction T1 are symmetrically distributed along the symmetrical axis P in the first direction T1. In this way, the space of the fan out region F may be utilized more reasonably, wiring design in the fan out region F is facilitated, and thus all the connection wires 30 in the fan out region F may meet the requirement of circuit layout.

It should be noted that in the embodiment of the present disclosure, referring to FIG. 2A, the length of each second straight wire portion 303 in the first direction T1 may be constructed as: a length of a part of the second straight wire portion 303 corresponding to the overlap region of the projections of the two auxiliary side edges 303a and 303b in the first direction T1 prevails, namely a length of a region where a width of the second straight wire portion 303 is consistent prevails.

As shown in FIG. 2B, taking four connection wires arranged symmetrically relative to the symmetrical axis P for example, in the driving backplane provided by the embodiment of the present disclosure, on one side of the symmetrical axis P, a length of one of the two auxiliary side edges, close to the symmetrical axis P, of each second straight wire portion 303 is smaller than or equal to that of the other auxiliary side edge. FIG. 2B makes illustration by taking the auxiliary side edge 303b close to the symmetrical axis P and the auxiliary side edge 303a far away from the symmetrical axis P for example, namely in each second straight wire portion 303, the length of the auxiliary side edge 303b is smaller than that of the auxiliary side edge 303a; and as for any two second straight wire portions 303 arranged in the second direction T2, any one of the two auxiliary side edges of one second straight wire portion 303 closer to the symmetrical axis P is smaller than or equal to any one of the two auxiliary side edges of the other second straight wire portion 303. For example, in FIG. 2B, on one hand, as for the two second straight wire portions 303 on the left side of the symmetrical axis P, the lengths of the two auxiliary side edges of one second straight wire portion 303 closer to the symmetrical axis P are smaller than those of the two auxiliary side edges of the other second straight wire portion. In this way, the second straight wire portions with smaller widths may be obtained so as to meet the requirement of a distance between the adjacent connection wires and prevent signal crosstalk between the adjacent wires. On the other hand, a smaller included angle in two included angles between the auxiliary side edge 303a of the second straight wire portion 303 and side edges of the oblique wire portion 302 connected with the auxiliary side edge 303a is a third included angle; a larger included angle in two included angles between the auxiliary side edge 303b of the second straight wire portion 303 and the side edges of the oblique wire portion 302 connected with the auxiliary side edge 303b is a fourth included angle; and thus on one side of the symmetrical axis P, the larger a distance between the second straight wire portion 303 and the symmetrical axis P is, the smaller the third included angle is and the larger the fourth included angle is. For example, in FIG. 2B, in the two adjacent connection wires 30 on the right side of the symmetrical axis P, a third included angle (31 is larger than a third included angle (32, and a fourth included angle α1 is smaller than a fourth included angle α2.

During actual application, in the driving backplane provided by the embodiment of the present disclosure, as shown in FIG. 1 and FIG. 2A, the signal wires 10 are electrically connected with the corresponding binding electrodes 20 through the connection wires 30, and the wire width d2 of each connection wire 30 at the second end b is set to be consistent with that of the signal wire 10, so that the wire width of each connection wire 30 may be larger without increasing the wiring difficulty, thus resistance of each connection wire 30 is smaller, and good product properties of the driving backplane are guaranteed. It should be noted that in the embodiment of the present disclosure, wire width of each connection wire 30 at the second end b being consistent with that of the signal wire 10 means that a difference between the wire width of the connection wire 30 at the second end b and the wire width of the signal wire 10 is smaller than a set value, namely the wire width of the connection wire 30 at the second end b and the wire width of the signal wire 10 are the same approximately.

Besides, in the embodiment of the present disclosure, taking the wire width d2 of the connection wire 30 at the second end b being consistent with that of the signal wire 10 for example. During specific implementation, the wire width d2 of the connection wire 30 at the second end b may be larger than or equal to the wire width of the signal wire 10, as long as the requirement of circuit design in the driving backplane may be met, and the wire width of the connection wire is not limited herein.

Besides, the wire width d1 of the connection wire 30 at the first end a is set to be larger than a width of each of the binding electrodes 20 connected thereto correspondingly. In order to guarantee the product properties, a minimum width of the connection wire 30 needs to be larger than a set threshold value, sizes of the binding electrodes 20 connected with the connection wires are smaller, and thus the wire width d1 of each connection wire 30 at the first end a may be set to be larger than the width of the binding electrode 20 connected thereto correspondingly. When the connection wires 30 are correspondingly connected with the plurality of binding electrodes 20, the wire width d1 of each connection wire 30 at the first end a may be larger than a sum of a total width and a gap of the corresponding binding electrodes 20; for example, the signal wires 10 are electrically and correspondingly connected with the three binding electrodes 20 through the connection wires 30, and the wire width of each connection wire 30 at the first end a is larger than the total width of the three binding electrodes 20 and the gap among the three binding electrodes 20. In this way, the width of each connection wire 30 may be further increased, and thus the resistance of each connection wire 30 is further reduced. It should be noted that the wire width of each connection wire 30 at the first end a is larger than the width of each of the binding electrodes 20 connected thereto correspondingly, and meanwhile it needs to be guaranteed that a certain distance is maintained between the adjacent connection wires 30, and the adjacent connection wires 30 are prevented from shorting.

Specifically, in the driving backplane provided by the embodiment of the present disclosure, the wire width of the above signal wire is 20-130 times the wire width of the binding electrode.

During specific implementation, the wire width of the binding electrode is about 70 μm, and the wire width of the signal wire is in a range between 1500 μm and 9000 μm. Obviously, in the miniature light emitting diode display apparatus, a difference between the wire width of the signal wire and the wire width of the binding electrode in the driving backplane is large, and consequently, the wire connection difficulty of the fan out region is large. In the embodiment of the present disclosure, the signal wires are electrically connected with the corresponding binding electrodes through the connection wires, and the technical problem of large wire connection difficulty in the fan out region is solved.

Figure 3:
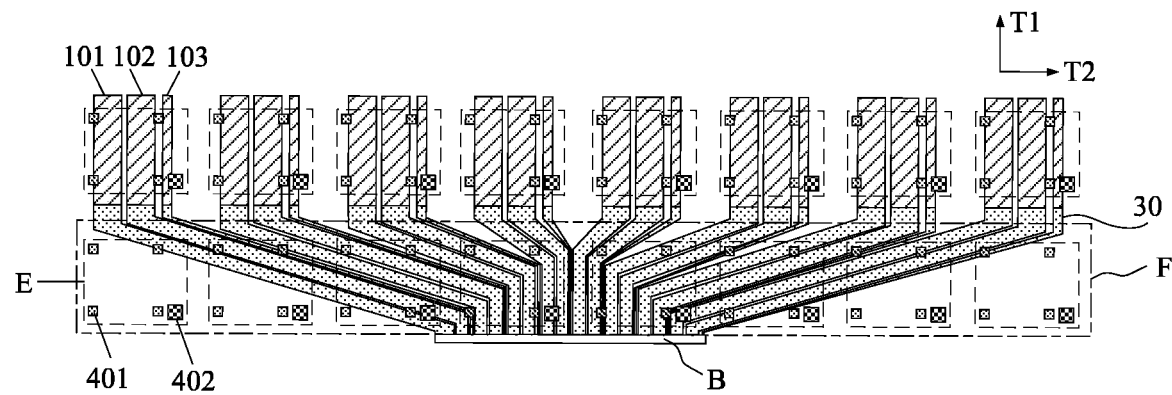
FIG. 3 is a second schematic structural diagram of a driving backplane provided by an embodiment of the present disclosure.

In some driving backplanes provided by the embodiment of the present disclosure, as shown in FIG. 3, the plurality of signal wires 10 includes: a plurality of power source signal wires 101, and a plurality of grounding wires 102. The driving backplane may further include: a plurality of connection electrodes arranged in pairs and to be bound to light emitting diodes 401. One of the connection electrodes arranged in pairs is electrically connected with the power source signal wire 101, and the other connection electrode is electrically connected with the grounding wire 102. Therefore, power may be provided for the light emitting diodes through the power source signal wires 101 and the grounding wires 102. During specific implementation, in order to reduce voltage loss of an electrical signal on the power source signal wires 101 and the grounding wires 102, the power source signal wires 101 and the grounding wires 102 may be set to be larger in wire width. For example, the wire width of each power source signal wire may be in a range between 3800 μm and 8800 μm, and the wire width of each grounding wire may be in a range between 1600 μm and 3800 μm. Certainly, other sizes are allowed and are not limited.

In some driving backplanes provided by the embodiment of the present disclosure, as shown in FIG. 3, the plurality of signal wires 10 further include: a plurality of power supply wires 103. The driving backplane may further include: a plurality of connection pads to be bound to control chips 402. The power supply wires are used for proving the electrical signal for the control chips 402, as load on an electrical signal channel where each power supply wire is located is low, the wire width of each power supply wire may be smaller compared with those of the power source signal wire 101 and the grounding wire 102. For example, the wire width of each power supply wire may be in a range between 800 μm and 1200 μm. Certainly, other sizes are allowed and are not limited.

During actual application, in the driving backplane provided by the embodiment of the present disclosure, as shown in FIG. 3, a minimum wire width of the oblique wire portion electrically connected with at least one of the plurality of power source signal wires 101 is the same as that of the oblique wire portion electrically connected with at least one of the plurality of grounding wires 102. It should be noted herein that in the embodiment of the present disclosure, a difference between the minimum wire width of the oblique wire portion electrically connected with at least one of the power source signal wires and the minimum wire width of the oblique wire portion electrically connected with at least one of the grounding wires is smaller than a set value, namely the minimum wire widths of both may be the same approximately.

Referring to FIG. 2A, each connection wire 30 may include: the first straight wire portion 301 extending in the first direction T1, the oblique wire portion 302 with the extending direction forming the certain included angle with the first direction T1, and the second straight wire portion 303 extending in the first direction T1. The wire width of the second straight wire portion 303 is larger than or equal to that of the oblique wire portion 302, and the wire width of the oblique wire portion 302 is larger than or equal to that of the first straight wire portion 301. The minimum wire width of the oblique wire portion 302 electrically connected with at least one of the power source signal wires 101 is the same as that of the oblique wire portion 302 electrically connected with at least one of the grounding wires 102, which may be constructed as: a wire width of one end, connected with the first straight wire portion, of the oblique wire portion electrically connected with at least one of the power source signal wires 101 is the same as a wire width of one end, connected with the first straight wire portion 301, of the oblique wire portion electrically connected with at least one of the grounding wires 102. Thus, the wire widths and distribution of all the first straight wire portions 301 in the fan out region F may be uniform, and the adjacent first straight wire portions 301 are prevented from shorting.

Specifically, in the driving backplane provided by the embodiment of the present disclosure, a ratio of the wire width of the power source signal wire to the wire width of the grounding wire is in a range between 0.18 and 1.1; and the wire width of the power source signal wire or the grounding wire is 20-125 times the width of the binding electrode. For example, the wire width of the power source signal wire and the wire width of the grounding wire are both 3800 μm, and the width of the binding electrode is 70 μm; or the wire width of the power source signal wire is 1600 μm, the wire width of the grounding wire is 8800 μm, and the width of the binding electrode is 70 μm.

As the wire width of each power source signal wire and the wire width of each grounding wire are large, generally, the wire width of the power source signal wire or the grounding wire may be in a range between 1500 μm and 9000 μm, so that the number of the binding electrodes electrically and correspondingly connected with the power source signal wire (or the grounding wire) is larger. During specific implementation, under the condition that the ratio of the wire width of the power source signal wire to the wire width of the grounding wire is in a range between 0.9 and 1.1, a difference between the number of the binding electrodes electrically connected with the power source signal wire and the number of the binding electrodes electrically connected with the grounding wire does not exceed 2. For example, the wire width of the power source signal wire and the wire width of the grounding wire are the same and are both 3800 μm, the number of the binding electrodes electrically and correspondingly connected with the power source signal wire may be 14, and the number of the binding electrodes electrically and correspondingly connected with the grounding wire may be 13. The number of the binding electrodes electrically and correspondingly connected with the power source signal wire (or the grounding wire) may be other values and will not be limited herein. During actual application, the number of the binding electrodes electrically and correspondingly connected with the power source signal wire and the number of the binding electrodes electrically and correspondingly connected with the grounding wire may be determined according to connection pins of elements like a driving chip or a flexible circuit board, etc. bound to the driving backplane.

During actual application, as the wire width of the signal wire (e.g., the power source signal wire or the grounding wire) is large, the number of the binding electrodes electrically and correspondingly connected with the signal wire is large, in order to make the connection wires in the fan out region meet a design requirement of electrical connection of a circuit in the driving backplane, the resistance and arrangement spacing of the connection wires in the fan out region are considered, and the minimum width of the oblique wire portions of the connection wires needs to be controlled in a certain range, e.g. between 1800 μm and 1815 μm.

As the number of the binding electrodes is matched with that of golden fingers of the elements like the driving chip or the flexible circuit board, etc., the signal wires with the same width are generally connected with the binding electrodes in the same number. In some cases, in order to be compatible with various driving backplanes with different sizes and designs, the signal wires with the same width, the difference between the numbers of the binding electrodes corresponding to the signal wires with the same width, e.g., the power source signal wire and the grounding wire may be controlled to be one or two. Every time the difference between the number of the binding electrodes corresponding to the power source signal wire and the number of the binding electrodes corresponding to the grounding wire is one, a difference between the wire width of the first straight wire portion in the connection wire connected with the power source signal wire and the wire width of the first straight wire portion in the connection wire connected with the grounding wire does not exceed two times of the width of one binding electrode, e.g., about 130 μm.

During specific implementation, in the driving backplane provided by the embodiment of the present disclosure, as shown in FIG. 3, the driving backplane includes a plurality of rows of light emitting regions E arranged in sequence in the first direction; each of the plurality of rows of light emitting regions E includes at least one light emitting diode; and at least one light emitting diode may be driven by the control chip or a pixel driving circuit including at least one thin film transistor. Taking the light emitting diode driven by the control chip for example, at least one control chip 402 is bound to the connection pad in the driving backplane, at least one light emitting diode 401 is bound to the connection electrode in the driving backplane, and the control chip 402 is coupled with the light emitting diode 401 through a signal connection wire.

After finishing fabrication of the driving backplane, the control chips are bound to the corresponding connection pads, and the light emitting diodes are bound to the corresponding connection electrodes. In order to guarantee good electrical connection, a film layer where the connection pads and the connection electrodes are located may be different from the film layer where the signal wires are located.

A connection position where each of the connection wires 30 is in direct contact with the corresponding signal wire 10 is located: in a direction (e.g., a direction shown by an arrow T1 in FIG. 3) from the first end of the connection wire 30 to its second end, in a region between the first row of light emitting regions and the second row of light emitting regions, namely, an orthographic projection of at least one of the connection wires 30 on the substrate overlaps with orthographic projections of the light emitting diodes in the first row of light emitting regions on the substrate. It may be understood that the first row of light emitting regions described in the embodiment of the present disclosure is one row of light emitting regions closest to one side edge of the substrate provided with the binding electrodes among the plurality of rows of light emitting regions. It may be understood that according to the size of the driving backplane and the number of the signal wires thereon, the orthographic projection of at least one of the connection wires 30 on the substrate overlaps with the orthographic projections of the light emitting diodes in the first row of light emitting regions on the substrate and may further overlap with orthographic projections of the light emitting diodes in the second row of light emitting regions on the substrate. The connection position where each of the connection wires 30 is in direct contact with the corresponding signal wire 10 moves into a display region subsequently.

In the embodiment of the present disclosure, referring to FIG. 2A, each connection wire 30 includes the first straight wire portion 301, the oblique wire portion 302, and the second straight wire portion 303; the extending directions of both the first straight wire portion 301 and the second straight wire portion 303 are consistent with the first direction T1; the certain included angle is formed between the extending direction of the oblique wire portion 302 and the first direction T1; and the wire width d1 of the connection wire 30 at the first end a is smaller than the wire width d2 of the connection wire 30 at the second end b, so that, the connection position where each of the connection wires is in direct contact with the corresponding signal wire may be located between the first row of light emitting regions and the second row of light emitting regions in the first direction T1. Thus, the light emitting diodes and the control chips in the first row of light emitting regions in the first direction T1 may be connected with the corresponding signal wires in the connection positions through routing wires extending in the first direction; the other rows of light emitting regions apart from the first row of light emitting regions may be connected with the corresponding signal wires through routing wires therein, and thus the routing wires corresponding to the first row of light emitting regions does not overlap with the routing wires corresponding to the other light emitting regions.

If all the connection wires 30 cannot be arranged in a space of the first row of light emitting regions, the connection position where each of the connection wires 30 is in direct contact with the corresponding signal wire needs to move upwards in the first direction, and then an area of the fan out region F is increased. The light emitting diodes and the control chips in the light emitting regions overlapping with the fan out region F need to be connected to the connection positions through the routing wires so as to be connected with the corresponding signal wires, consequently, lead wires corresponding to the different light emitting regions overlap, the wiring complexity is increased, and overlap capacitance may occur and affect signal transmission. Taking the connection positions located between the second row of light emitting regions and the third row of light emitting regions for example, the light emitting diodes and the control chips in the first row of light emitting regions need to be connected to the connection positions through the routing wires, and the light emitting diodes and the control chips in the second row of light emitting regions need to be connected to the connection positions through the routing wires, when the routing wires corresponding to the first row of light emitting regions and the routing wires corresponding to the second row of light emitting regions are designed, overlapping of both routing wires need to be avoided. Thus, in the embodiment of the present disclosure, the connection positions are located between the first row of light emitting regions and the second row of light emitting regions, overlapping of the lead wires may be avoided, wire connection below the connection positions is simple, the number of the upward lead wires of the light emitting regions is reduced, and a phenomenon of shorting of a driving circuit is prevented.

As shown in FIG. 3, the light emitting regions E in the same column are connected with the same power source signal wire 101, namely, the power source signal wire 101 may provide power for the light emitting diodes in the same column of light emitting regions E. The light emitting regions E in the same column are connected with the same grounding wire 102, namely the grounding wire 102 may be electrically connected with the control chips in one column of light emitting regions E. During specific implementation, the plurality of signal wires 10 in the embodiment of the present disclosure may further include the plurality of power supply wires 103 connected with the control chips and a plurality of addressing signal wires (not shown). The control chips in the same column of light emitting regions E are electrically connected with the same power supply wire 103, and thus power is provided for each of the control chips in one column of light emitting regions E. Every two columns of light emitting regions E correspond to one addressing signal wire, and connection modes may differ according to different driving logics of the specific control chips. Generally, loads of signal channels where the power supply wire 103 and the addressing signal wire are located are low, thus the power supply wire and the addressing signal wire may be narrower than the power source signal wire 101 and the grounding wire 102 in wire width, specifically, a wire width of the power supply wire 103 may be about 1 mm, and a wire width of the addressing signal wire may be about 500 μm. Connection wires corresponding to the power supply wires 103 and the addressing signal wires may be arranged according to the space in the fan out region F. During actual wiring design, the connection wires corresponding to the signal wires with larger wire width may be designed firstly, and then the connection wires corresponding to the signal wires with smaller wire width may be designed.

Figure 4:
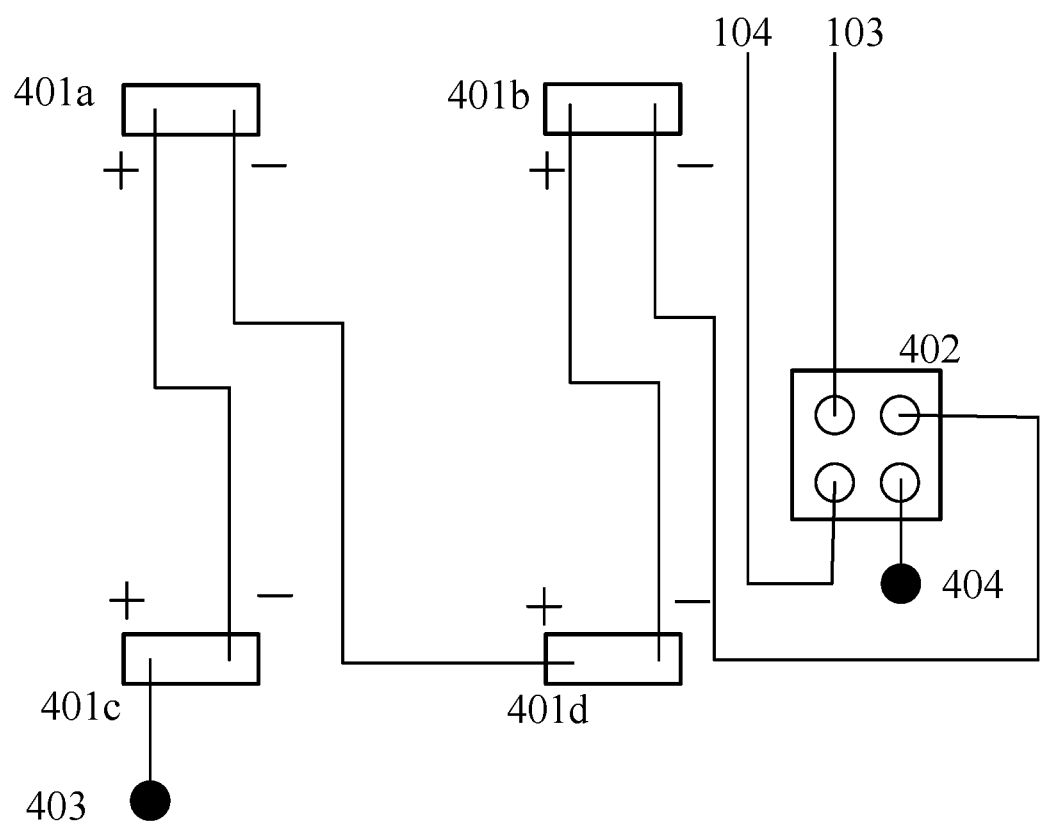
FIG. 4 is a schematic specific structural diagram of a light emitting region in an embodiment of the present disclosure.

FIG. 4 is a schematic specific structure diagram of a single light emitting region E. As shown in FIG. 4, in order to illustrate a connection relation of each of the light emitting diodes and each of the control chips clearly, a structure shown in FIG. 4 is a schematic diagram after binding of the driving backplane, the light emitting diodes and the control chips. Specifically, each of the light emitting diodes is bound to the corresponding connection electrode in the light emitting region, and the control chip is bound to the connection pad in the light emitting region. FIG. 4 makes illustration by taking four light emitting diodes 401 (401a, 401b, 401c and 401d) included in each of the light emitting regions for example, during specific implementation, the number of the light emitting diodes corresponding to the light emitting region may be other values and will not be limited herein.

As shown in FIG. 4, the control chip 402 is electrically connected with the power supply wire 103 and the addressing signal wire 104. The power supply wire 103 may provide electric energy for the control chip 402. The addressing signal wire 104 may transmit an address signal to the control chip 402. The control chip 402 may obtain a to-be-transmitted address by parsing the address signal. Besides, the control chip 402 may be electrically connected with the grounding wire through the first voltage end 404. All the light emitting diodes 401 (401a, 401b, 401c and 401d) corresponding to the light emitting region are connected in series in sequence. Besides, each of the light emitting diodes 401 (401a, 401b, 401c and 401d) is connected between a second voltage end 403 and the control chip 402. The second voltage end 403 is electrically connected with the power source signal wire, so that power is provided for each of the light emitting diodes in the light emitting region.

Based on the same inventive concept, an embodiment of the present disclosure further provides a display apparatus, including: the driving backplane mentioned above, and a plurality of light emitting diodes electrically connected with the driving backplane. The display apparatus may be applied to a mobile phone, a tablet PC, a television, a display, a laptop, a digital photo frame, a navigator and any other products or parts with a display function. As a principle of solving the problem of the display apparatus is similar to that of the driving backplane, implementation of the display apparatus may refer to implementation of the driving backplane mentioned above, and repetition is omitted.

During specific implementation, the plurality of light emitting diodes may be bound to connection electrodes in the driving backplane so as to realize electrical connection between the light emitting diodes and the driving backplane. In order to make a resolution of a display image higher and a display effect better, the above light emitting diode may adopt a miniature light emitting diode or a mini light emitting diode in small size.

Specifically, in order to realize colored display of the display apparatus, a blue light emitting diode may be adopted, and a color film layer is arranged on a light emitting side of the light emitting diode. The color film layer includes: a plurality of red conversion units and a plurality of green conversion units. Light rays emitted by the blue light emitting diodes irradiate the red conversion units, so that blue light may be converted into red light; light rays emitted by the blue light emitting diodes irradiate the green conversion units, so that the blue light may be converted into green light; and converted red light and green light are combined with the blue light, so that white light may be obtained, and thus colored display is realized.

In the embodiment of the present disclosure, signal wires are electrically connected with corresponding binding electrodes through connection wires, and the technical problem of large wire connection difficulty of a fan out region is solved. A wiring design process of the driving backplane provided by the embodiment of the present disclosure is described in detail below in combination with the drawings.

A width of a binding region and the number of signal wires in the driving backplane, and widths of the binding electrode in one-to-one correspondence with golden fingers of a driving chip or a flexible circuit board determine the number of the binding electrodes corresponding to each of the signal wires.

In order to guarantee product properties, minimum wire widths of oblique wire portions in the connection wires corresponding to power source signal wires and grounding wires in the fan out region need to be the same, and a certain distance needs to be maintained between the adjacent connection wires. A wire width of the power source signal wire is basically the same as that of the grounding wire. However, when the number of the binding electrodes distributed to each of the power source signal wires is different from that of the binding electrodes distributed to each of the grounding wires, if the power source signal wires and the grounding wires are directly connected with the corresponding binding electrodes, it may not be guaranteed that the minimum wire widths of the oblique wire portions in the connection wires corresponding to the power source signal wires and the grounding wires are the same, and the distance between the adjacent connection wires fails to be guaranteed. Therefore, the embodiment of the present disclosure provides the following design scheme.

Specifically, according to the requirement of circuit design, as the number of light emitting regions needing to be driven by the power source signal wires and the grounding wires is large, in order to reduce resistance, the wire width of the power source signal wire and the wire width of the grounding wire are large, the width of the power source signal wire is basically the same as that of the grounding wire, e.g., 3800 μm. A width of the power supply wire is smaller than that of the power source signal wire or the grounding wire, e.g., the width of the power supply wire may be in a range between 800 μm and 1200 μm, such as 1000 μm, namely a ratio of the wire width of the power source signal wire to the wire width of the power supply wire is in a range between 3 and 5. A distance between the power source signal wire and the grounding wire adjacent thereto needs to be larger than 200 μm, and a distance between the grounding wire and the power supply wire adjacent thereto is larger than 100 μm. Likewise, in a binding region, a suspended electrode needs to be arranged between the binding electrodes correspondingly connected with the two adjacent signal wires, so that crosstalk of electrical signals between the adjacent signal wires is avoided, and stable transmission of electrical signals is guaranteed.

Figure 5:
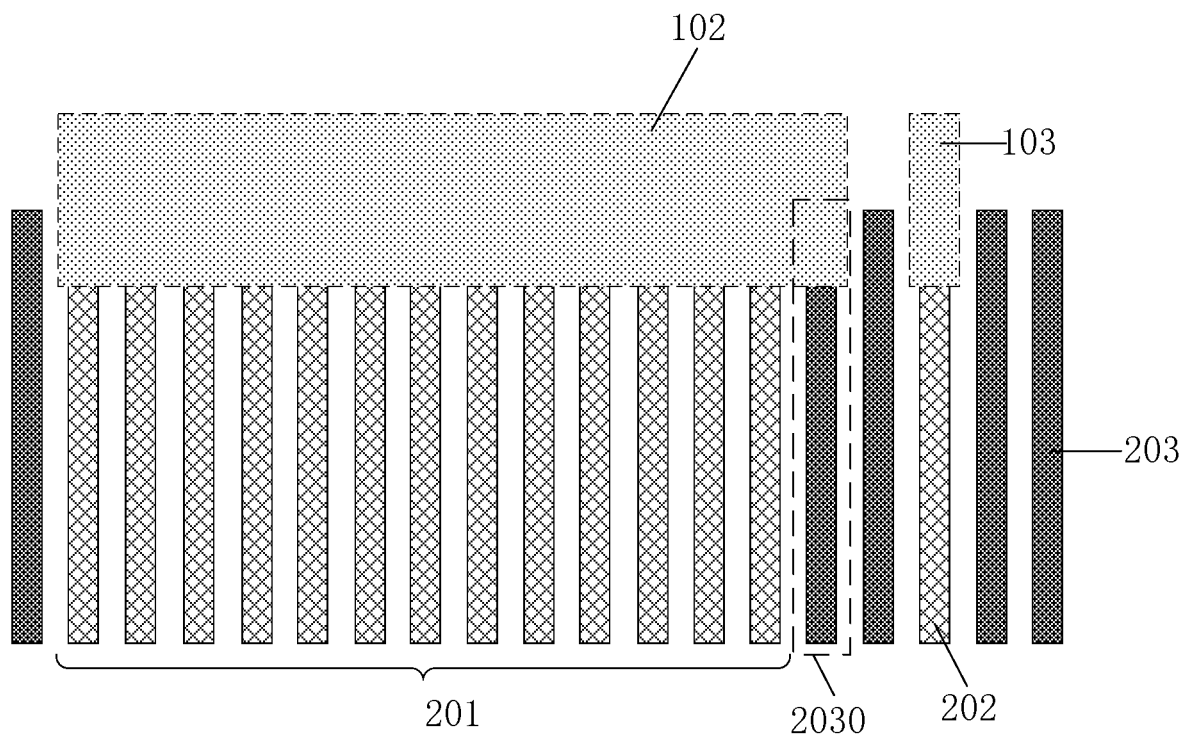
FIG. 5 is a schematic partial diagram of a binding region in an embodiment of the present disclosure.

As shown in FIG. 5, the 13 binding electrodes 201 correspondingly and electrically connected with the grounding wire 102, the binding electrode 202 correspondingly and electrically connected with the power supply wire 103 and the suspended electrodes 203 are arranged. The figure makes illustration by taking the two suspended electrodes 203 arranged between the binding electrodes corresponding to the two adjacent signal wires for example, during specific implementation, the number of the suspended electrodes may be set according to the actual condition and will not be limited herein. In the related art, the suspended electrodes 203 are generally not electrically connected with the signal wires. Besides, as the grounding wires 102 and the power supply wires 103 are electrically connected with the corresponding binding electrodes through the connection wires instead of being directly electrically connected with the binding electrodes. Therefore, in FIG. 5, a dotted line frame represents the grounding wire 102 and the power supply wire 103 to illustrate a corresponding relation of the grounding wire 102, the power supply wire 103 and the binding electrodes.

In the embodiment of the present disclosure, for example, each of the power source signal wires corresponds to the 14 binding electrodes, and each of the grounding wires corresponds to the 13 binding electrodes.

First of all, as it needs to be guaranteed that minimum wire widths of the oblique wire portions in the connection wires corresponding to the power source signal wires and the grounding wires are the same, during wire connection design for the grounding wires, referring to FIG. 5, the suspended electrode adjacent to the 13 binding electrodes corresponding to the current grounding wire 102 may be borrowed, namely the suspended electrode 2030 shown by the dotted line frame. That is to say, like one power source signal wire corresponding to the 14 binding electrodes, one grounding wire 102 may correspond to the 14 binding electrodes (the 13 binding electrodes 201 and one suspended electrode 2030).

Figure 6:
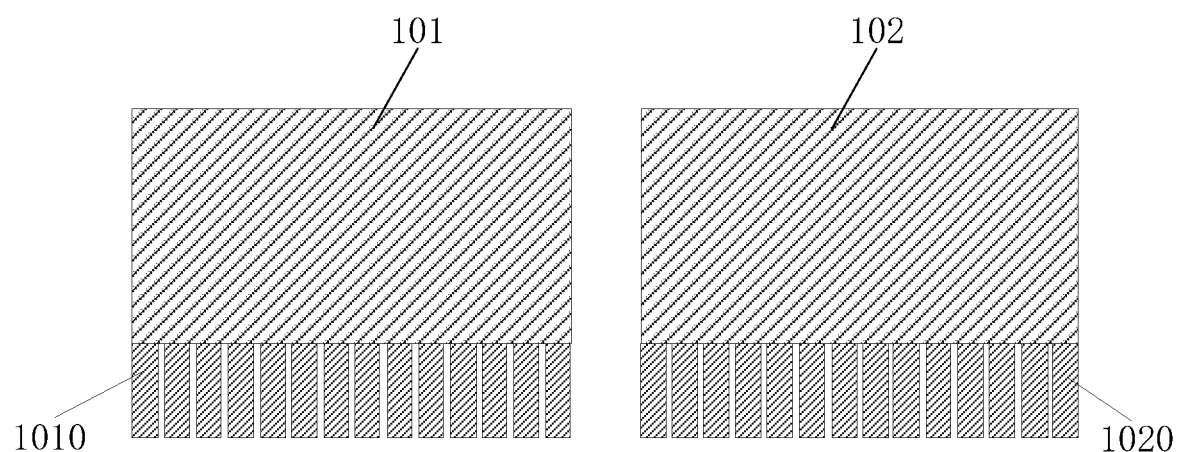
FIG. 6 is a schematic diagram of division of signal wires in an embodiment of the present disclosure.
Figure 7:
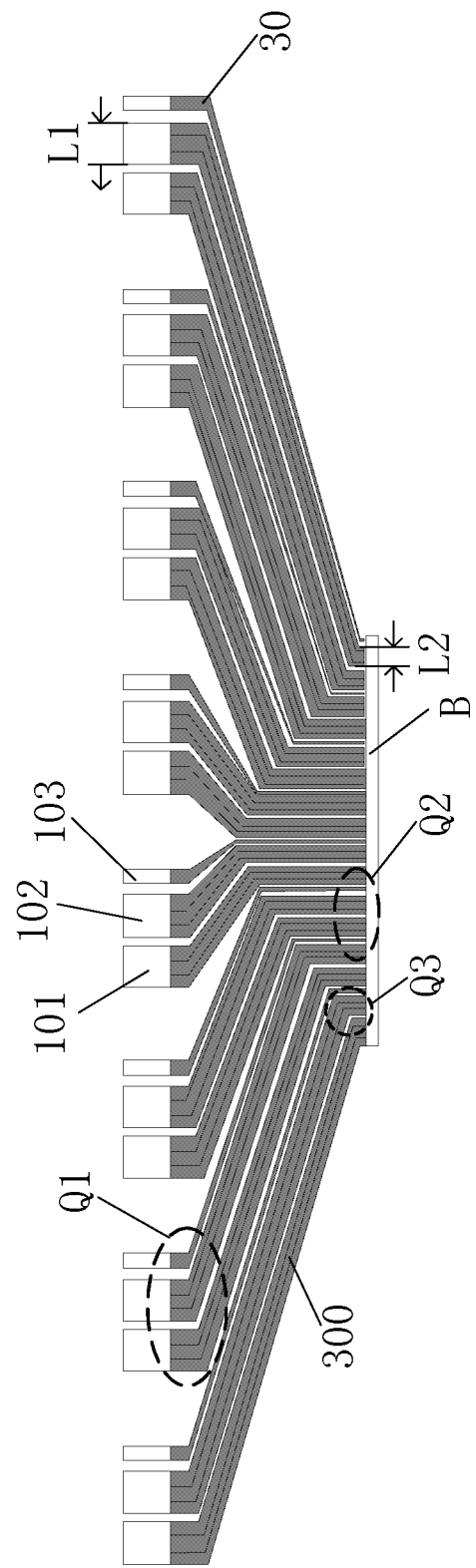
FIG. 7 is a schematic structural diagram after wire connection.

Second, referring to FIG. 7, as the wire width of each power source signal wire 101 and the wire width of each grounding wire 102 are large, a width L2 of a region where the plurality of binding electrodes correspondingly connected with each of the power source signal wires 101 or the grounding wires 102 are located is about ½ of the wire width L1 of each of the power source signal wires 101 or the ground wires 102, and direct connection of the both is difficult. Therefore, in the embodiment of the present disclosure, according to the number of the binding electrodes corresponding to each of the signal wires, each of the wider signal wires is divided into a plurality of auxiliary signal wires. As shown in FIG. 6, according to a corresponding relation between the signal wire and the number of the binding electrodes, 14 auxiliary power source signal wires 1010 are formed by dividing the power source signal wire

101 at one end to be connected with the connection wire; and 14 auxiliary grounding wires 1020 are formed by dividing the grounding wire 102 at one end to be connected with the connection wire.

Third, it is considered that the auxiliary signal wires are connected with the corresponding binding electrodes through the plurality of auxiliary connection wires. Specifically, first ends of the auxiliary connection wires are connected with the binding electrodes, second ends of the auxiliary connection wires are connected with the auxiliary power source signal wires (or the auxiliary grounding wires). Similar to a structure of the connection wire, each of the auxiliary connection wires may include: a first auxiliary straight wire portion, an auxiliary oblique wire portion and a second auxiliary straight wire portion. Here, in needs to determine a wire width and a wire spacing of one end of each of the auxiliary connection wires connected with the power source signal wire (or the grounding wire). Specifically, as the suspended electrode is borrowed, the number of the binding electrodes corresponding to the power source signal wire is the same as that of the binding electrodes corresponding to the grounding wire, e.g., 14. Taking the power source signal wire for example, the power source signal wire is divided into the 14 auxiliary power source signal wires, and 13 wire seams exist between the 14 auxiliary power source signal wires. Hypothetically, a wire width of each of the auxiliary power source signal wires is x and a width of each wire seam is y, an equation may be obtained: $14x+13y=3800$ (μm), $x>y$, many solutions to the equation may exist, a set of integer solutions may be obtained through calculation: $x=225$ μm, $y=50$ μm, namely the wire width of each auxiliary power source signal wire may be 225 μm, and the width of the wire seam between the two adjacent auxiliary power source signal wires may be 50 μm. Likewise, a wire width of the auxiliary grounding wire may be 225 μm, and the width of the wire seam between the two adjacent auxiliary grounding wires may be 50 μm. Thus, the first ends of the auxiliary connection wires are electrically connected with the binding electrodes, the second ends of the auxiliary connection wires are electrically connected with the auxiliary power source signal wires (or the auxiliary grounding wires), and the width of the second end of each auxiliary connection wire may be the same as that of the auxiliary power source signal wire (or the auxiliary grounding wire), so that the width of the second end of each auxiliary connection wire may be 225 μm, and the distance between the auxiliary connection wires may be 50 μm.

Fourth, the width and the spacing of each auxiliary connection wire at the first end are determined. Referring to FIG. 5, the width of each of the binding electrodes is about 70 μm, a distance between the two adjacent binding electrodes is about 60 μm, and a width of a repeated cycle is 130 μm, namely, a total width of the width of the 14 binding electrodes corresponding to one power source signal wire (or one grounding wire) and the 13 spacing is about: $14\times70+13\times60=1760$ (μm). In the circuit requirement, the minimum wire width of the oblique wire portion in the connection wire corresponding to the power source signal wire and the grounding wire is 1800 μm, thus if the width of the first end 300 of the auxiliary connection wire is the same as that of the binding electrode, the circuit requirement may not be met. Therefore, the first end 300 of the auxiliary connection wire needs to be widened. Hypothetically, the width of the first end 300 of each auxiliary connection wire is m, spacing between the two adjacent auxiliary connection wires is m, and an equation may be obtained: $14m+13n\geq1800$ (μm). In order to prevent the adjacent binding electrodes from shorting, it needs to be guaranteed that a width of a repeated cycle of the auxiliary connection wires is the same as that of a repeated cycle of the binding electrodes, namely, $m+n=130$ (μm). Two sets of solutions are obtained through calculation: $m=115$ μm, $n=15$ μm; or $m=110$ μm, $n=20$ μm. Considering processing, due to the influence of a process, an actual wire width is smaller than a designed wire width, thus $m=115$ μm and $n=15$ μm may be selected, and it may be guaranteed that the finally formed connection wires meet the circuit requirement.

Fifth, referring to FIG. 5 and FIG. 6, based on the wire width and wire spacing of each auxiliary connection wire determined according to the design requirement, the 14 auxiliary connection wires need to be correspondingly connected with the 14 auxiliary power source signal wires 1010 and the corresponding 14 binding electrodes, the 14 auxiliary connection wires need to be correspondingly connected with the 14 auxiliary grounding wires 1020 and the corresponding 13 binding electrodes, and a structure after wire connection may be shown in FIG. 7. It may be seen from FIG. 7 that the power source signal wires 101 and the grounding wires 102 are correspondingly connected with the binding region B through the auxiliary connection wires 300, and the power supply wires 103 are connected with the binding region B through the connection wires 30.

It should be noted that in FIG. 7, the wire width of each power source signal wire 101 and the wire width of each grounding wire 102 are large, each power source signal wire 101 and each grounding wire 102 are correspondingly connected with the binding region B through the plurality of auxiliary connection wires 300. As the auxiliary connection wires 300 are dense, in order to illustrate the auxiliary connection wires 300 more clearly in FIG. 7, the three auxiliary connection wires 300 represent the plurality of auxiliary connection wires 300 connected with the power source signal wire 101 (or the grounding wire 102). Actually, the number of the auxiliary connection wires 300 connected with each power source signal wire 101 (or each grounding wire 102) may be larger than 3, e.g., 14.

As the wire width of each power supply wire 103 is small, each power supply wire 103 may be connected with the corresponding binding electrode in the binding region B through one connection wire 30.

Figure 8:
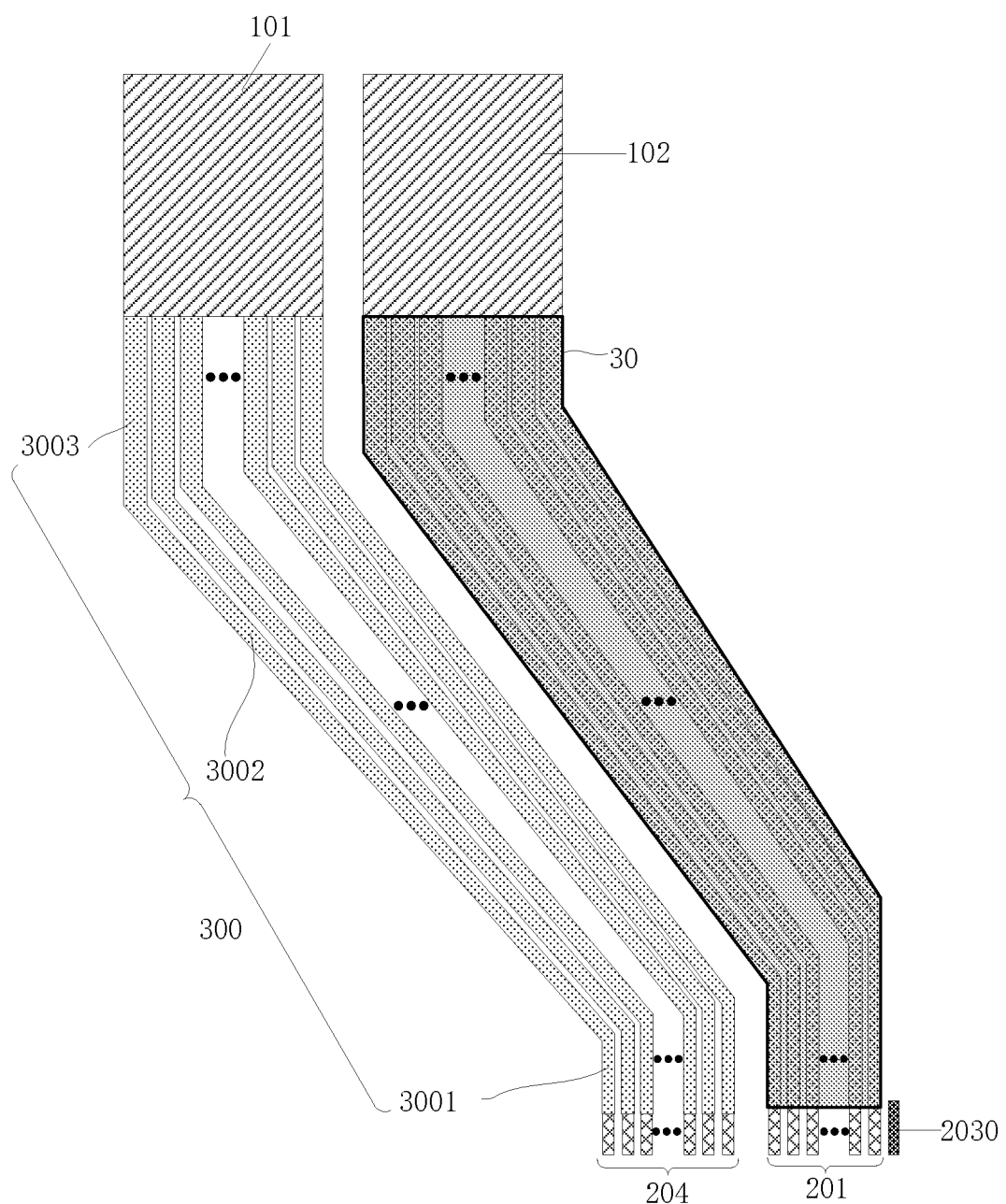
FIG. 8 is a schematic diagram of connecting power source signal wires and grounding wires with corresponding binding electrodes through a plurality of auxiliary connection wires in FIG. 7.

FIG. 8 is a schematic enlargement diagram of power source signal wires 101 and grounding wires 102 being connected with corresponding binding electrodes through a plurality of auxiliary connection wires 300 in FIG. 7. Specifically, each of the auxiliary connection wires 300 may include: the first auxiliary connection wire 3001, the auxiliary oblique wire portion 3002 and the second auxiliary straight wire portion 3003. In the figure, 204 represents the plurality of binding electrodes corresponding to the power source signal wire 101, 201 represents the plurality of binding electrodes corresponding to the grounding wire 102, and 2030 represents the suspended electrode borrowed by the grounding wire 102 in the wire connection design process.

Figure 9:
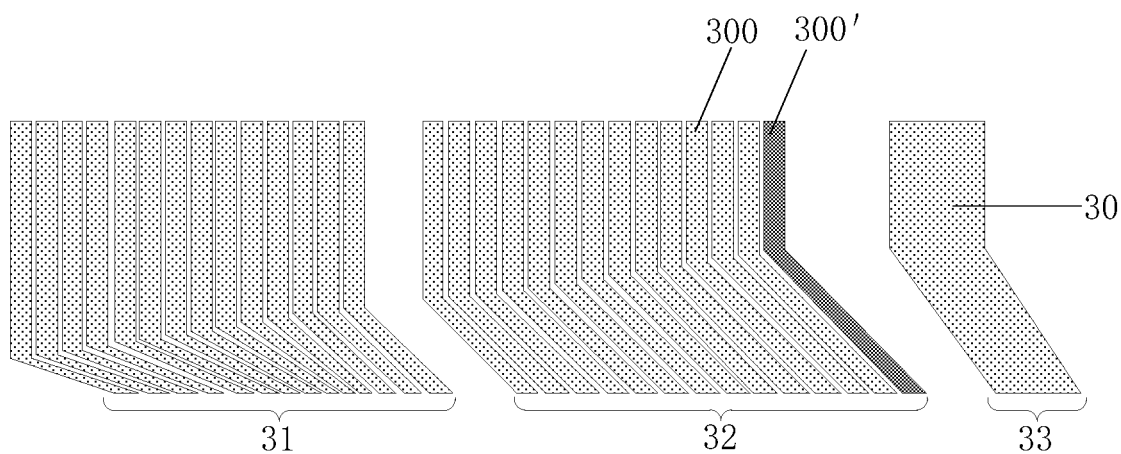
FIG. 9 is a schematic enlargement diagram of a region Q1 in FIG. 7.

FIG. 9 is a schematic enlargement diagram of a region Q1 in FIG. 7, 31 represents the plurality of auxiliary connection wires 300 connected with the power source signal wire, and 32 represents the plurality of auxiliary connection wires 300 and one auxiliary connection wire 300' connected with the grounding wire. 300' represents the auxiliary connection wire corresponding to the suspended electrode, and 33 represents the connection wire 30 connected with the power supply wire.

Figure 10:
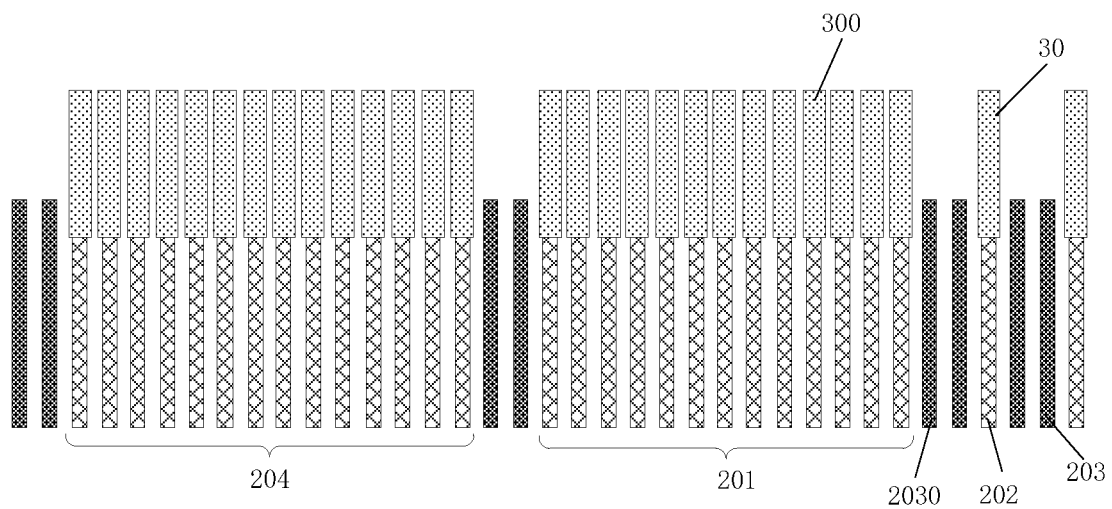
FIG. 10 is a schematic enlargement diagram of a region Q2 in FIG. 7.

FIG. 10 is a schematic enlargement diagram of a region Q2 in FIG. 7. In the figure, 204 represents the 14 binding electrodes connected with the power source signal wire, 201 represents the 13 binding electrodes connected with the grounding wire, 202 represents the binding electrode connected with the power supply wire, and 203 represents the suspended electrode.

Figure 11:
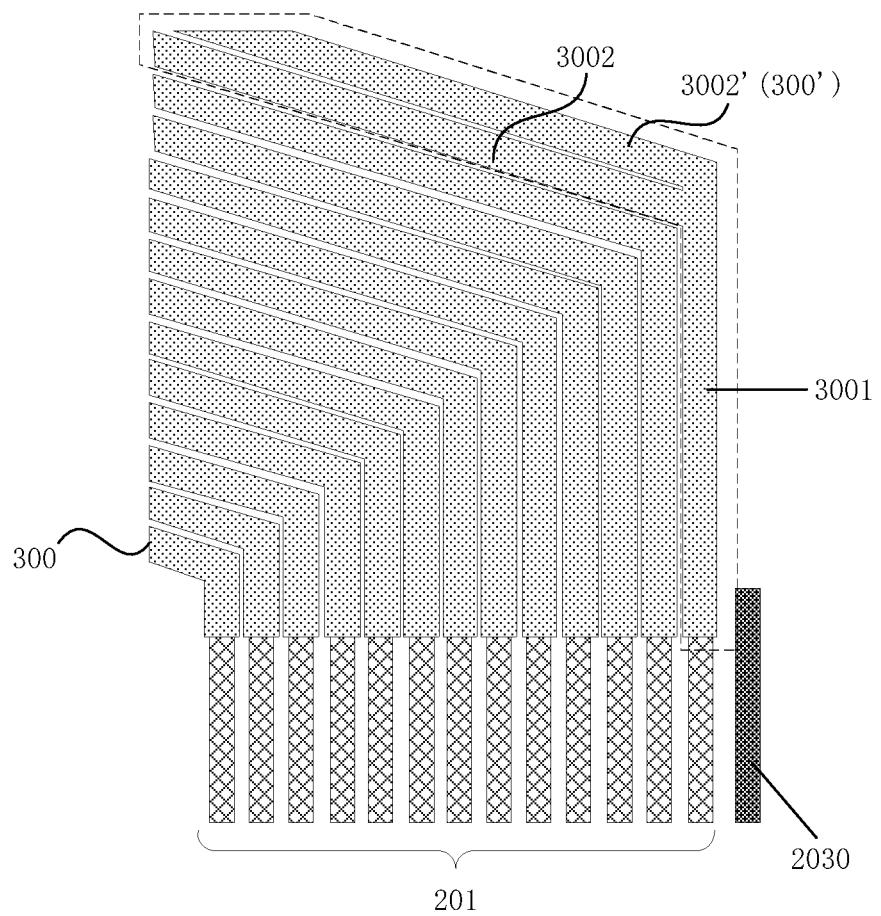
FIG. 11 is a schematic enlargement diagram of a region Q3 in FIG. 7.

FIG. 11 is a schematic enlargement diagram of a region Q3 in FIG. 7. As shown in FIG. 11, in order to prevent the suspended electrode from affecting normal work of the signal wires and meanwhile prevent the grounding wires and the power supply wires from unfavorable situations like signal crosstalk, etc., in the wire connection process, among the plurality of auxiliary connection wires corresponding to one grounding wire, the auxiliary connection wire 300' corresponding to the suspended electrode may not be electrically connected with the suspended electrode, so that the auxiliary connection wire 300' need to be the auxiliary connection wire connected with the binding electrode closest to the suspended electrode, sharing the same first straight wire portion 3001 and electrically connected with the binding electrode. Namely, a structure shown by a dotted line frame in FIG. 11 includes: the auxiliary oblique wire portions 3002 and 3002' which are parallel to each other and are spaced, and only one auxiliary straight wire portion 3001. Thus, it is guaranteed that each of the auxiliary connection wires connected with one of the grounding wires is connected with the binding electrode which transmits an effective electrical signal, thereby avoiding connection between the auxiliary connection wire and the suspended electrode.

Figure 12:
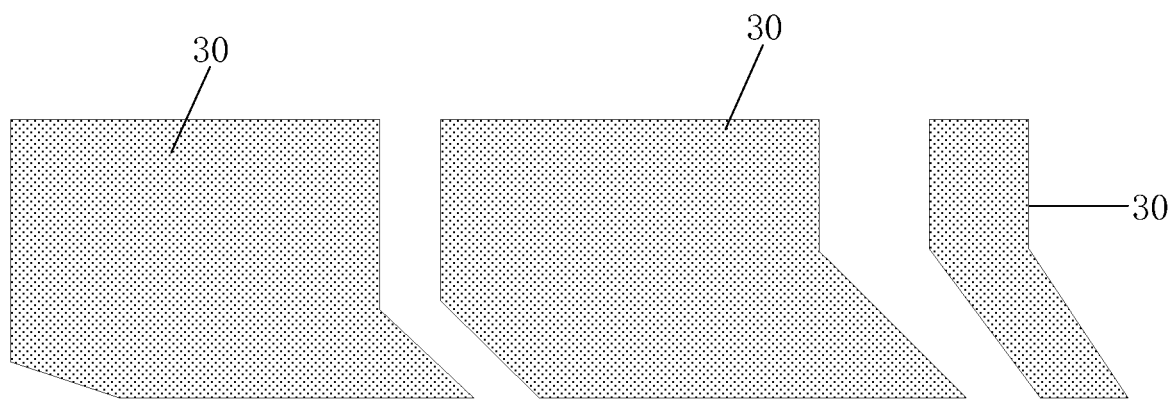
FIG. 12 is a structure of incorporating auxiliary connection wires as connection wires in FIG. 9.

Finally, the plurality of auxiliary connection wires connected with one of the signal wires are incorporated as the connection wire. As mentioned above, the signal wire is divided into the auxiliary signal wires which correspond to the number of the binding electrodes and meet the requirement of the minimum wire width requirement, and then in the process of designing paths for corresponding connection of the auxiliary connection wires and the binding electrodes, spacing exists between the adjacent auxiliary signal wires, e.g., about 15 μm. In view of this, the auxiliary connection wires connected with the same signal wire need to be combined into an integrated structure without a hollow-out region (namely spacing). Specifically, as shown in FIG. 8, outlines of the two auxiliary connection wires closest to the outer side among the auxiliary connection wires connected with the same grounding wire 102 may be obtained to form a sealed shape, and thus a pattern of the connection wire 30 is obtained. FIG. 12 is a schematic enlargement structural diagram of connection wires 30 shown in a region Q1 in FIG. 7 obtained after connection of outlines of the auxiliary connection wires 300 in FIG. 9, which are connection wires connected with the power source signal wire 101, the grounding wire 102 and the power supply wire 103 in sequence from left to right.

Figure 13:
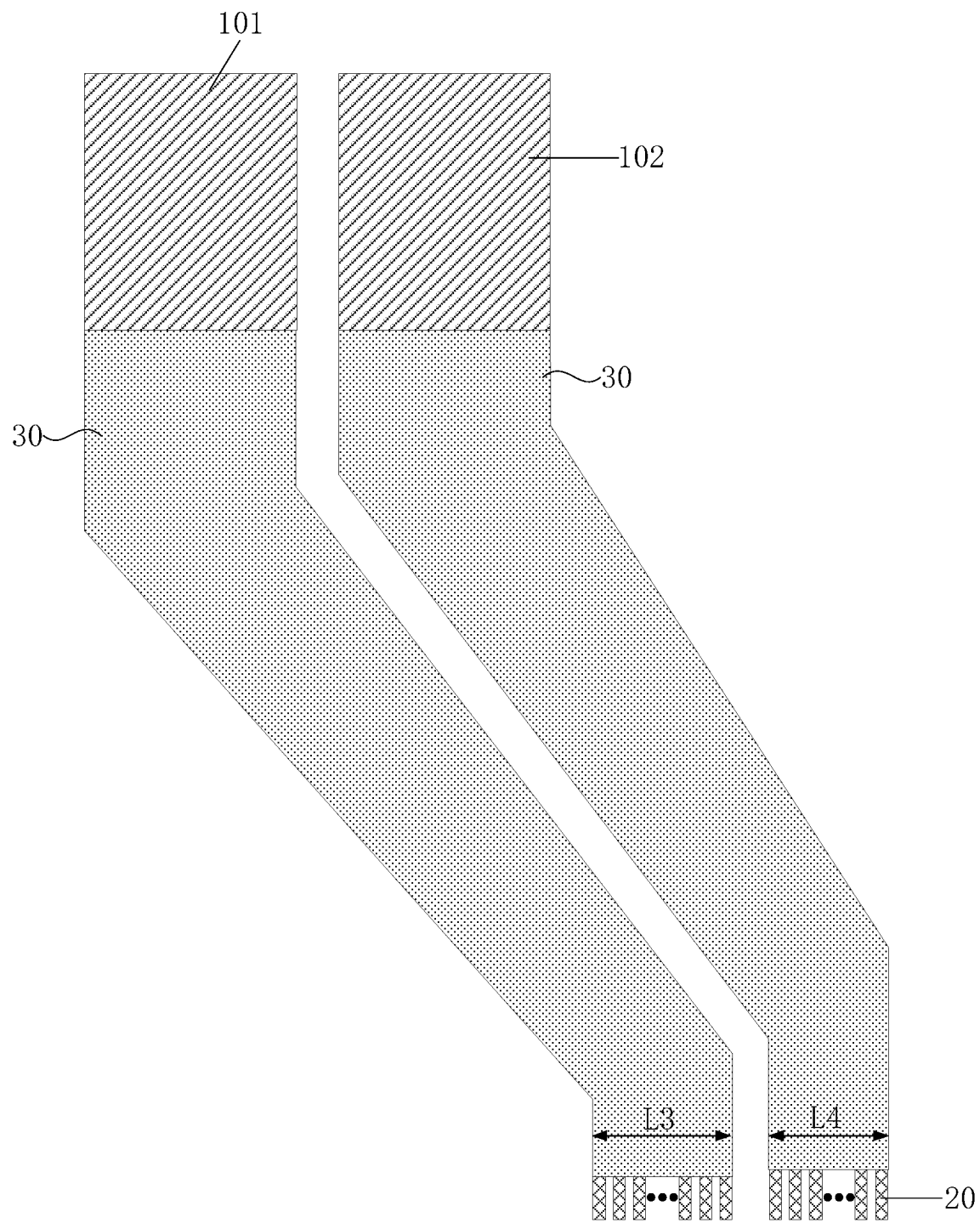
FIG. 13 is a schematic enlargement diagram of connecting signal wires with corresponding binding electrodes through connection wires in an embodiment of the present disclosure.

FIG. 13 is a schematic enlargement diagram of finally obtained power source signal wires 101 and grounding wires 102 being connected with corresponding binding electrodes 20 through connection wires 30. As shown in FIG. 13, in the finally obtained fan out region, the minimum wire width of the oblique wire portion in the connection wire 30 corresponding to the power source signal wire 101 and the minimum wire width of the oblique wire portion in the connection wire 30 corresponding to the grounding wire 102 are basically consistent. A difference between a wire width L3 of the first straight wire portion in the connection wire 30 corresponding to the power source signal wire 101 and a wire width L4 of the first straight wire portion in the connection wire 30 corresponding to the grounding wire 102 does not exceed widths of the two first auxiliary straight wire portions.

In some embodiments, the step "incorporating the plurality of auxiliary connection wires connected with one of the signal wires as the connection wire" may not be performed, namely, one of the signal wires is connected with the plurality of corresponding binding electrodes directly through a mode of the plurality of auxiliary connection wires. Sums of the wire widths of the oblique wire portions of the plurality of connection wires corresponding to the different signal wires are basically consistent. For example, the sum of the wire widths of the oblique wire portions of the plurality of auxiliary connection wires corresponding to the power source signal wire is basically consistent with a sum of the wire widths of the oblique wire portions of the auxiliary connection wires corresponding to the grounding wire.

It should be noted that in the wiring design process provided by the embodiment of the present disclosure, by borrowing the suspended electrode adjacent to the binding electrodes corresponding to each grounding wires, hypothetically, the number of the binding electrodes corresponding to each power source signal wire is the same as that of the binding electrodes corresponding to each grounding wire, thus in the fan out region obtained after wiring design, the minimum wire widths of the oblique wire portions in the connection wires corresponding to the power source signal wires and the grounding wires respectively are basically consistent. During specific implementation, in the wiring design process, when the number of the binding electrodes corresponding to each power source signal wire is the same as that of the binding electrodes corresponding to each grounding wire, the suspended electrode does not need to be borrowed, and wiring design may be performed directly.

Referring to FIG. 1, relative to the oblique wire portions of the connection wires 30 on the two sides, a length of the oblique wire portion of the connection wire 30 close to the symmetrical axis P is small, and thus a certain difference exists between the resistance of the connection wires 30 on the two sides and the resistance of the connection wire 30 close to the symmetrical axis P. In order to make a ratio of resistance between signal transmission channels corresponding to all the connection wires 30 be in a preset range and reduce the situation of signal delay, the embodiment of the present disclosure may at least adopt the following modes for realizing equal resistance design of all the connection wires 30.

Mode 1.

Figure 14:
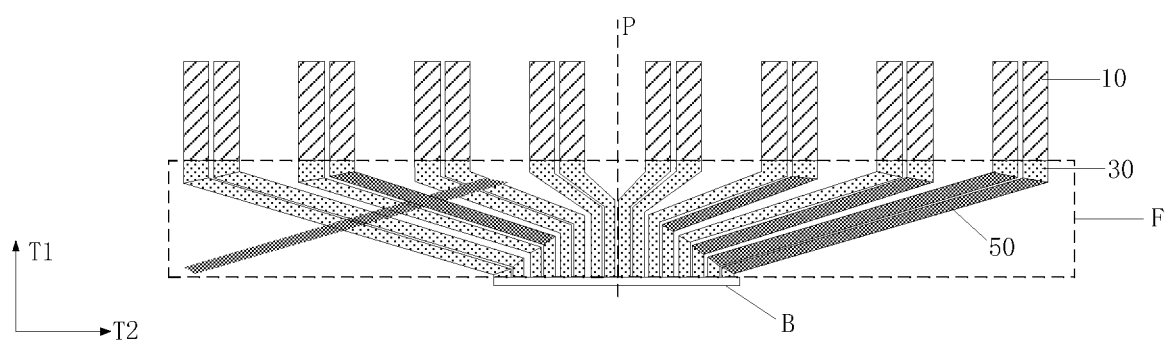
FIG. 14 is a schematic diagram of an arrangement mode of assisting connection wires in an embodiment of the present disclosure.

As shown in FIG. 14, the assisting connection wires 50 are arranged at least at the connection wires 30 on the two sides, and double-layer parallel-connection routing is formed between the assisting connection wires 50 and the corresponding connection wires 30. For example, the assisting connection wires 50 may be arranged in the positions of the oblique wire portions of the corresponding connection wires 30. Besides, in order to prevent the assisting connection wires 50 from occupying the space of the fan out region F, the assisting connection wires 50 and the connection wires 30 may be arranged on different layers. In order to reduce fabrication cost, the assisting connection layers 50 may be arranged on the same layer as other metal film layers in the diving backplane.

In order to further reduce the resistance difference of all the connection wires 30 in the fan out region F, the assisting connection wires 50 may be arranged at the connection wires 30 on the two sides, and no assisting connection wire 50 is arranged at the connection wires 30 close to the symmetrical axis P, namely, the connection wires 30 in the middle are in single-layer routing. Besides, lengths of the assisting connection wires 50 are gradually reduced from the two sides to the middle.

Mode 2.

Figure 15:
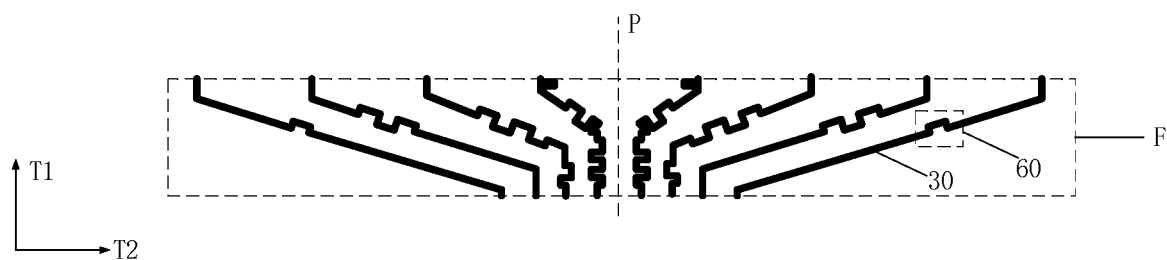
FIG. 15 is a schematic diagram of an arrangement mode of a bending wire structure in an embodiment of the present disclosure.

As shown in FIG. 15, on the basis of guaranteeing that the minimum wire widths of the oblique wire portions of the connection wires 30 meet the requirement of the circuit design, bending wire structures 60 are arranged at least in the connection wires 30 close to the symmetrical axis P. Besides, the bending wire structures included in the connection wire 30 are gradually reduced from the middle to the two sides, for example, the number of the bending wire structures 60 may be gradually reduced, or the size of each bending wire structure may be gradually reduced. Besides, the bending wire structures 60 may be arranged in any position of the oblique wire portion, the first straight wire portion or the second straight wire portion in the connection wire 30.

It should be noted that FIG. 15 only intends to illustrate approximate positions of bending wire structures 60 and does not limit the size and the shape of the connection wire 30; and the size (e.g., wire width) and the shape of the connection wire 30 still meet the definition of the embodiment of the present disclosure.

In the embodiment of the present disclosure, equal resistance design of all the connection wires is illustrated, e.g., in mode 1 and mode 2. During specific implementation, in order to make resistances of all the connection wires consistent, mode 1 and mode 2 may be combined, namely, the assisting connection wires 50 may be arranged at least at the connection wires 30 on the two sides, and meanwhile the bending wire structures 60 may be arranged at least in the connection wires 30 close to the symmetrical axis P, or other modes may be adopted, which is not limited herein as long as the resistances of the all the connection wires may be consistent.

According to the driving backplane and the display apparatus provided by the embodiment of the present disclosure, the signal wires are electrically connected with the corresponding binding electrodes through the connection wires. In the direction from the first end of the connection wire to its second end, the wire width of at least one of the plurality of connection wires is in a trend of gradually increasing. At least one of the plurality of connection wires includes the first straight wire portion and the oblique wire portion. Through the wire connection mode, the wiring space of the driving backplane may be fully utilized, thus all the connection wires may meet the requirement of the driving circuit, certain spacing is allowed between the connection wires, and the phenomenon of crossing of the connection wires is prevented. Moreover, the area of the fan out region may be reduced, and the wiring difficulty of the signal wires is lowered.

Apparently, those skilled in the art may make various changes and transformation for the present disclosure without departing from the spirit and scope of the present disclosure. In this case, if these changes and transformations of the present disclosure belong to the scope of claims and their equivalents, the present disclosure also intends to include these changes and transformations.

What is claimed is:

1. A driving backplane, comprising:
    a substrate, and a plurality of signal wires, a plurality of binding electrodes and a plurality of connection wires arranged on the substrate;
    wherein at least one of the plurality of signal wires extends in a first direction;
    a first end of any one of the plurality of connection wires is electrically connected with at least one of the plurality of binding electrodes, and a second end of the any one of the plurality of connection wires is electrically connected with one of the plurality of signal wires;
    a wire width of at least one of the plurality of connection wires at the first end is smaller than a wire width at the second end;
    the at least one of the plurality of connection wires comprises: a first straight wire portion extending in the first direction, and an oblique wire portion with an extending direction forming a certain included angle with the first direction; and
    one end of the first straight wire portion is electrically connected with a part of the plurality of binding electrodes, and the other end of the first straight wire portion is electrically connected with one of the plurality of signal wires through the oblique wire portion.

2. The driving backplane according to claim 1, comprising a plurality of rows of light emitting regions arranged in sequence in the first direction;
    wherein an orthographic projection of the at least one of the plurality of connection wires on the substrate overlaps with an orthographic projection of a first row of light emitting regions on the substrate; and
    the first row of light emitting regions are light emitting regions closest to one side edge, provided with the plurality of binding electrodes, of the substrate among the plurality of rows of light emitting regions.

3. The driving backplane according to claim 1, wherein in a direction from the first end of the at least one connection wire to the second end, a wire width of the oblique wire portion in a direction perpendicular to its own extending direction is gradually increased, and the wire width of the oblique wire portion is larger than or equal to that of the first straight wire portion.

4. The driving backplane according to claim 1, wherein the first straight wire portion of the at least one connection wire comprises two auxiliary side edges in the first direction; and
    a width of a part of the first straight wire portion corresponding to an overlap region of projections of the two auxiliary side edges in the first direction is consistent in a direction perpendicular to the first direction.

5. The driving backplane according to claim 4, wherein in a second direction, a length of each of first straight wire portions in the first direction is in a trend of increasing firstly and then decreasing; and
    the second direction is the direction perpendicular to the first direction.

6. The driving backplane according to claim 5, wherein in the second direction, lengths of the first straight wire portions in the first direction are symmetrically distributed along a symmetrical axis in the first direction.

7. The driving backplane according to claim 6, wherein on one side of the symmetrical axis, a length of one of the two auxiliary side edges of the each first straight wire portion close to the symmetrical axis is larger than or equal to a length of the other auxiliary side edge; and
    as for any two first straight wire portions arranged in the second direction, any one of the two auxiliary side edges of one first straight wire portion closer to the symmetrical axis is larger than or equal to any one of the two auxiliary side edges of the other first straight wire portion.

8. The driving backplane according to claim 1, wherein the at least one connection wire further comprises: a second straight wire portion extending in the first direction;

the oblique wire portion is electrically connected with one of the plurality of signal wires through the second straight wire portion; and a wire width of the second straight wire portion is larger than or equal to that of the oblique wire portion.

9. The driving backplane according to claim 8, wherein the second straight wire portion of the at least one connection wire comprises two auxiliary side edges in the first direction; and a width of a part of the second straight wire portion corresponding to an overlap region of projections of the two auxiliary side edges in the first direction is consistent in a direction perpendicular to the first direction.

10. The driving backplane according to claim 9, wherein in a second direction, a length of each of second straight wire portions in the first direction is in a trend of decreasing firstly and then increasing; and the second direction is the direction perpendicular to the first direction.

11. The driving backplane according to claim 10, wherein in the second direction, lengths of the second straight wire portions in the first direction are symmetrically distributed along a symmetrical axis.

12. The driving backplane according to claim 11, wherein on one side of the symmetrical axis, a length of one of the two auxiliary side edges of the each second straight wire portion close to the symmetrical axis is smaller than or equal to a length of the other auxiliary side edge; and as for any two second straight wire portions arranged in the second direction, any one of the two auxiliary side edges of one second straight wire portion closer to the symmetrical axis is smaller than or equal to any one of the two auxiliary side edges of the other second straight wire portion.

13. The driving backplane according to claim 1, wherein the wire width of the at least one connection wire at the second end is consistent with a wire width of one of the plurality of signal wires.

14. The driving backplane according to claim 1, wherein the wire width of the at least one connection wire at the first end is larger than a width of each of the plurality of binding electrodes connected thereto correspondingly.

15. The driving backplane according to claim 1, wherein a wire width of one of the plurality of signal wires is 20-130 times a width of one of the plurality of binding electrodes.

16. The driving backplane according to claim 1, wherein the plurality of signal wires comprise:

a plurality of power source signal wires, and a plurality of grounding wires;

the driving backplane further comprises: a plurality of connection electrodes arranged in pairs and to be bound to light emitting diodes; and one of the connection electrodes arranged in pairs is electrically connected with one of the power source signal wires, and the other connection electrode is electrically connected with one of the grounding wires.

17. The driving backplane according to claim 16, wherein a minimum wire width of the oblique wire portion electrically connected with at least one of the plurality of power source signal wires is equal to that of the oblique wire portion electrically connected with at least one of the plurality of grounding wires.

18. The driving backplane according to claim 17, wherein a ratio of a wire width of each of the plurality of power source signal wires to a wire width of each of the plurality of grounding wires is in a range between 0.18 and 1.1; and the wire width of the each power source signal wire or the each grounding wire is 20-125 times a width of each of the plurality of binding electrodes.

19. The driving backplane according to claim 18, wherein when the ratio of the wire width of the each power source signal wire to the wire width of the each grounding wire is in a range between 0.9 and 1.1, a difference between a quantity of binding electrodes electrically connected with the each power source signal wire and a quantity of binding electrodes electrically connected with the each grounding wire does not exceed 2.

20. A display apparatus, comprising: the driving backplane according to claim 1, and a plurality of light emitting diodes electrically connected with the driving backplane.

* * * * *